(12) United States Patent
Krogstrup et al.

(10) Patent No.: US 10,367,132 B2
(45) Date of Patent: Jul. 30, 2019

(54) NANOSCALE DEVICE COMPRISING AN ELONGATED CRYSTALLINE NANOSTRUCTURE

(71) Applicant: University of Copenhagen, Copenhagen K (DK)

(72) Inventors: Peter Krogstrup, København Ø (DK); Thomas Sand Jespersen, København Ø (DK); Charles M. Marcus, København Ø (DK); Jesper Nygård, København Ø (DK)

(73) Assignee: University of Copenhagen (DK)

( * ) Notice: Subject to any disclaimer, the term of this patent is extended or adjusted under 35 U.S.C. 154(b) by 191 days.

(21) Appl. No.: 15/322,701

(22) PCT Filed: Jul. 2, 2015

(86) PCT No.: PCT/EP2015/065110
§ 371 (c)(1),
(2) Date: Dec. 28, 2016

(87) PCT Pub. No.: WO2016/001365
PCT Pub. Date: Jan. 7, 2016

(65) Prior Publication Data
US 2017/0141285 A1 May 18, 2017

(30) Foreign Application Priority Data

Jul. 2, 2014 (EP) ..................................... 14175342
Feb. 10, 2015 (EP) ..................................... 15154459

(51) Int. Cl.
*H01L 39/24* (2006.01)
*H01L 39/02* (2006.01)
(Continued)

(52) U.S. Cl.
CPC .............. *H01L 39/02* (2013.01); *B82Y 10/00* (2013.01); *B82Y 40/00* (2013.01); *C23C 14/28* (2013.01);
(Continued)

(58) Field of Classification Search
None
See application file for complete search history.

(56) References Cited

FOREIGN PATENT DOCUMENTS

WO  WO 2008/073529 A2  6/2008

OTHER PUBLICATIONS

Belzig, "Device Physics: Super semiconducting Nanowires," Nature Nanotechnology, vol. 1, 2 pages, Dec. 2006.
(Continued)

*Primary Examiner* — Cory W Eskridge
(74) *Attorney, Agent, or Firm* — Sunstein Kann Murphy & Timbers LLP

(57) ABSTRACT

The present disclosure relates to nanoscale device comprising an elongated crystalline nanostructure, such as a nanowire crystal, a nanowhisker crystal or a nanorod crystal, and a method for producing thereof. One embodiment relates to a nanoscale device comprising an elongated crystalline semiconductor nanostructure, such as a nanowire (crystal) or nanowhisker (crystal) or nanorod (crystal), having a plurality of substantially plane side facets, a crystalline structured first facet layer of a superconductor material covering at least a part of one or more of said side facets, and a second facet layer of a superconductor material covering at least a part of the first facet layer, the superconductor material of the second facet layer being different from the superconductor material of the first facet layer, wherein the crystalline structure of the semiconductor nanostructure is epitaxially matched with the crystalline structure of the first
(Continued)

facet layer on the interface between the two crystalline structures.

20 Claims, 19 Drawing Sheets

(51) Int. Cl.
| | |
|---|---|
| *B82Y 10/00* | (2011.01) |
| *B82Y 40/00* | (2011.01) |
| *H01L 29/43* | (2006.01) |
| *H01L 29/66* | (2006.01) |
| *H01L 29/06* | (2006.01) |
| *H01L 29/41* | (2006.01) |
| *H01L 39/22* | (2006.01) |
| *H01L 39/12* | (2006.01) |
| *C23C 14/28* | (2006.01) |
| *C30B 11/12* | (2006.01) |
| *C30B 23/02* | (2006.01) |
| *C30B 23/06* | (2006.01) |
| *C30B 29/62* | (2006.01) |

(52) U.S. Cl.
CPC ............ *C30B 11/12* (2013.01); *C30B 23/025* (2013.01); *C30B 23/066* (2013.01); *C30B 29/62* (2013.01); *H01L 29/0673* (2013.01); *H01L 29/413* (2013.01); *H01L 29/437* (2013.01); *H01L 29/66469* (2013.01); *H01L 39/025* (2013.01); *H01L 39/125* (2013.01); *H01L 39/221* (2013.01); *H01L 39/223* (2013.01); *H01L 39/228* (2013.01); *H01L 39/2432* (2013.01); *H01L 39/2493* (2013.01); *Y10S 977/762* (2013.01); *Y10S 977/81* (2013.01); *Y10S 977/891* (2013.01); *Y10S 977/938* (2013.01); *Y10S 977/943* (2013.01)

(56) References Cited

OTHER PUBLICATIONS

Chang, "Superconducting Proximity Effect in InAs Nanowires," Harvard University, 192 pages, Jun. 2014.
De Boeck, et al., "Hybrid epitaxial structures for spintronics," Thin Solid Films, vol. 412, pp. 3-13, 2002.
Frolov, et al., "Quantum computing based on semiconductor nanowires," MRS Bulletin, vol. 38, pp. 809-815, Oct. 2013.
Krogstrup, et al., "Semiconductor—Superconductor Nanowire Epitaxy," Center for Quantum Devices, 26 pages, 2014.
Leonard, et al., "Electrical contacts to one- and two-dimensional nanomaterials," Nature Nanotechnology, vol. 6, pp. 773-783, Dec. 2011.
Nadj-Perge, et al., "Spin-orbit qubit in a semiconductor nanowire," Nature, vol. 468, 11 pages, Dec. 23, 2010.
Petersson, et al., "Superconducting qubits with semiconductor nanowire Josephson junctions," Abstract Submitted for Mar. 15 Meeting of the American Physical Society, 1 page, 2014.
Roddaro, et al., "Hot-Electron Effects in InAs Nanowire Josephson Junctions," Nano Res., vol. 4, No. 3, pp. 259-265, 2011.
Rokhinson, et al., "The fractional a.c. Josephson effect in a semiconductor-superconductor nanowire as a signature of Majorana particles," Nature Physics, vol. 8, pp. 795-799, Nov. 2012.
Yang, et al., "Growth of alkali halides by molecular-beam epitaxy," Physical Review B, vol. 41, No. 12, 14 pages, Apr. 15, 1990.
Ziino, "Analysis of InAs-nanowires coated with Al by high-resolution TEM and energy dispersive X-ray spectroscopy," 19 pages, Sep. 2, 2012.
Ziino, et al., "Epitaxial aluminum contacts to InAs nanowires," Center for Quantum Devices, 14 pages, 2013.
International Searching Authority, European Patent Office, International Search Report and Written Opinion, International Appl. No. PCT/EP2015/065110, 15 pages, dated Oct. 14, 2015.

Fig. 14

| Domain fraction | | | | | | | | | |
|---|---|---|---|---|---|---|---|---|---|
| ZB//FCC | 1/2 | 1/3 | 2/3 | 1/4 | 3/4 | 1/5 | 2/5 | 3/5 | 4/5 |
| FCC metal | Lattice const. | 0.5 | 0.333 | 0.667 | 0.25 | 0.75 | 0.2 | 0.4 | 0.6 | 0.8 |
| Ne | 4.43 | 31.6 | 54.4 | 8.8 | 65.8 | 2.6 | 72.6 | 45.3 | 17.9 | 9.4 |
| Al | 4.05 | 25.2 | 50.1 | 0.3 | 62.6 | 12.2 | 70.1 | 40.2 | 10.2 | 19.7 |
| Ar | 5.26 | 42.4 | 61.6 | 23.2 | 71.2 | 13.6 | 77.0 | 53.9 | 30.9 | 7.9 |
| Ca | 5.58 | 45.7 | 63.8 | 27.6 | 72.9 | 18.6 | 78.3 | 56.6 | 34.9 | 13.1 |
| Ni | 3.52 | 13.9 | 42.6 | 14.7 | 57.0 | 29.1 | 65.6 | 31.2 | 3.3 | 37.7 |
| Cu | 3.61 | 16.1 | 44.1 | 11.9 | 58.0 | 25.9 | 66.4 | 32.9 | 0.7 | 34.3 |
| Kr | 5.72 | 47.0 | 64.7 | 29.4 | 73.5 | 20.6 | 78.8 | 57.6 | 36.5 | 15.3 |
| Sr | 6.08 | 50.2 | 66.8 | 33.6 | 75.1 | 25.3 | 80.1 | 60.1 | 40.2 | 20.3 |
| Rh | 3.8 | 20.3 | 46.9 | 6.3 | 60.1 | 19.6 | 68.1 | 36.2 | 4.3 | 27.5 |
| Pd | 3.89 | 22.1 | 48.1 | 3.8 | 61.1 | 16.8 | 68.9 | 37.7 | 6.6 | 24.6 |
| Ag | 4.09 | 25.9 | 50.6 | 1.3 | 63.0 | 11.1 | 70.4 | 40.8 | 11.1 | 18.5 |
| Xe | 6.2 | 51.1 | 67.4 | 34.9 | 75.6 | 26.7 | 80.5 | 60.9 | 41.4 | 21.8 |
| Ce | 5.16 | 41.3 | 60.9 | 21.7 | 70.6 | 11.9 | 76.5 | 53.0 | 29.6 | 6.1 |
| Yb | 5.49 | 44.8 | 63.2 | 26.4 | 72.4 | 17.2 | 77.9 | 55.9 | 33.8 | 11.7 |
| Ir | 3.84 | 21.1 | 47.4 | 5.2 | 60.6 | 18.3 | 68.4 | 36.9 | 5.3 | 26.2 |
| Pt | 3.92 | 22.7 | 48.5 | 3.0 | 61.4 | 15.9 | 69.1 | 38.2 | 7.3 | 23.6 |
| Au | 4.08 | 25.8 | 50.5 | 1.0 | 62.9 | 11.4 | 70.3 | 40.6 | 10.9 | 18.8 |
| Pb | 4.95 | 38.8 | 59.2 | 18.4 | 69.4 | 8.2 | 75.5 | 51.0 | 26.6 | 2.1 |
| Ac | 5.31 | 43.0 | 62.0 | 23.9 | 71.5 | 14.4 | 77.2 | 54.4 | 31.5 | 8.7 |
| Th | 5.08 | 40.4 | 60.2 | 20.5 | 70.2 | 10.6 | 76.1 | 52.3 | 28.4 | 4.6 |
| ZB//BCC | | | | | | | | | | |
| Li | 3.49 | 13.2 | 42.1 | 15.7 | 56.6 | 30.2 | 65.3 | 30.6 | 4.2 | 38.9 |
| Na | 4.23 | 28.4 | 52.3 | 4.5 | 64.2 | 7.4 | 71.4 | 42.7 | 14.1 | 14.6 |
| K | 5.23 | 42.1 | 61.4 | 22.8 | 71.0 | 13.1 | 76.8 | 53.7 | 30.5 | 7.3 |
| V | 3.02 | 0.3 | 33.1 | 33.7 | 49.8 | 50.5 | 59.9 | 19.8 | 20.4 | 60.5 |
| Cr | 2.88 | 5.2 | 29.9 | 40.2 | 47.4 | 57.8 | 57.9 | 15.9 | 26.2 | 68.3 |
| Fe | 2.87 | 5.5 | 29.6 | 40.7 | 47.2 | 58.3 | 57.8 | 15.6 | 26.7 | 68.9 |
| Rb | 5.59 | 45.8 | 63.9 | 27.7 | 72.9 | 18.7 | 78.3 | 56.6 | 35.0 | 13.3 |
| Nb | 3.3 | 8.2 | 38.8 | 22.4 | 54.1 | 37.7 | 63.3 | 26.6 | 10.2 | 46.9 |
| Mo | 3.15 | 3.8 | 35.9 | 28.2 | 51.9 | 44.2 | 61.5 | 23.1 | 15.4 | 53.9 |
| Cs | 6.05 | 49.9 | 66.6 | 33.2 | 75.0 | 24.9 | 80.0 | 59.9 | 39.9 | 19.9 |
| Ba | 5.02 | 39.7 | 59.8 | 19.5 | 69.8 | 9.5 | 75.9 | 51.7 | 27.6 | 3.5 |
| Eu | 4.61 | 34.3 | 56.2 | 12.4 | 67.1 | 1.4 | 73.7 | 47.4 | 21.2 | 5.1 |
| Ta | 3.31 | 8.5 | 39.0 | 22.0 | 54.2 | 37.3 | 63.4 | 26.8 | 9.8 | 46.4 |
| W | 3.16 | 4.1 | 36.1 | 27.8 | 52.1 | 43.8 | 61.7 | 23.3 | 15.0 | 53.4 |

*Fig. 18*

| Domain fraction | | 1/2 | 1/3 | 2/3 | 1/4 | 3/4 | 1/5 | 2/5 | 3/5 | 4/5 |
|---|---|---|---|---|---|---|---|---|---|---|
| fcc metal | lattice const | 0.5 | 0.333 | 0.667 | 0.25 | 0.75 | 0.2 | 0.4 | 0.6 | 0.8 |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| BCC | | | | | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

*Fig. 19*

| Domain fraction | | 1/2 | 1/3 | 2/3 | 1/4 | 3/4 | 1/5 | 2/5 | 3/5 | 4/5 |
|---|---|---|---|---|---|---|---|---|---|---|
| fcc metal | lattice const | 0.5 | 0.333 | 0.667 | 0.25 | 0.75 | 0.2 | 0.4 | 0.6 | 0.8 |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| BCC | | | | | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

*Fig. 20*

NANOSCALE DEVICE COMPRISING AN ELONGATED CRYSTALLINE NANOSTRUCTURE

CROSS-REFERENCE TO RELATED APPLICATIONS

This application is a U.S. National Stage application of International Application No. PCT/EP2015/065110 filed Jul. 2, 2015, which claims priority to EP 14175342.6 filed Jul. 2, 2014 and EP 15154459.0 filed Feb. 10, 2015, the entire contents of each of which are hereby incorporated by reference herein, for all purposes.

TECHNICAL FIELD

The present disclosure relates to nanoscale device comprising an elongated crystalline nanostructure, such as a nanowire crystal, a nanowhisker crystal or a nanorod crystal, and a method for producing thereof.

BACKGROUND ART

Electronic band gap engineering, doping, strain profiles and confinement in crystalline semiconductors, is a research field made possible by epitaxial growth of two-dimensional heterostructure crystals. The ability to tailor and design the electronic environment has revolutionized semiconductor technology and has led to breakthroughs in many areas, such as modern transistors, photovoltaics and laser technologies. Nanostructured crystals, such as nanowires, have drawn a lot of attention recently and recent advances in the epitaxial growth of nanostructured crystals such as nanowires, have opened new possibilities of tailoring the electronic environment, which has led to a wide variety of promising device applications, especially electronic devices. However, the performance of electronic devices based on nanostructured crystals depends on the quality of the interfaces between the different materials used.

SUMMARY OF EMBODIMENTS

Semiconductor-metal interfaces play a key role in device applications ranging from quantum transport to photovoltaic devices. However, the performance of nanowire crystal based devices has been limited by the uncontrolled electronic environment as a result of the interfaces, which contains unbound states and possibly defects and impurities. A controlled electrical contacting of nanostructures would open new paths for designing high quality nanoscale devices. The present disclosure therefore relates to nanoscale device comprising an elongated crystalline nanostructure, such as a nanowire (crystal) or nanowhisker (crystal) or nanorod (crystal), having a plurality of substantially plane side facets and a first facet layer covering at least a part of one or more of said side facets, i.e. of at least part of the length of the elongated crystalline nanostructure.

The presently disclosed nanoscale (or nanometer scale) device can be seen as a hybrid and/or heterostructured nanoscale device with the elongated crystalline nanostructure having a (at least a first) facet layer and may be referred to as such in this document.

Core-shell semiconductor heterostructure (i.e. having layers of different materials) growth is known in the art and can be used as surface passivation, but the semiconductor/metal (SE/M) interfaces has so far been uncontrolled on the atomic scale. The presently disclosed nanoscale devices where a first facet layer is deposited on the side facet(s) of an elongated crystalline nanostructure overcome this problem providing controlled electrical contacts of nanostructures. The nanoscale devices have been realized and exemplified by means of bottom-up growth of semiconductor/metal core-shell nanowire crystals by molecular beam epitaxy (MBE), preferably by combination of vapour liquid solid (VLS) growth and MBE. One embodiment uses InAs for the nanowire crystal and Al is grown with epitaxially matched single plane interfaces, which can be regarded as the ultimate limit of disorder free contact.

In one embodiment of the invention each two-dimensional interface between a side facet of the elongated crystalline nanostructure and the first facet layer is lattice matched and/or domain matched in at least one dimension, possibly in both dimensions. Naturally the elongated crystalline nanostructure may be provided in a semiconducting material, e.g. a semiconducting material selected from the group of III-V combinations, such as InAs, InP, InSb, GaAs, GaSb, AlSb and InGaAs, or group IV elements such as Si or Ge, or II-VI combinations such as ZnO, ZnSe and CdSe, or I-VII combinations. However, the elongated crystalline nanostructure may be provided in a metal or insulator material. The first facet layer may naturally be a metal but may be many types of materials. Further, the first facet layer may be provided in a material with superconducting properties below a critical temperature $T_c$.

A key aspect of the presently disclosed nanoscale device is that the elongated nanostructure is crystalline, i.e. it is a single crystal or it is composed of several crystals, e.g. large single crystal elements, forming a crystalline structure. In some embodiments the elongated crystalline nanostructure may be seen as a substantially one-dimensional crystalline structure. The presently disclosed nanoscale device has been demonstrated in InAs with an Al facet layer with Wurtzite (WZ)/FCC or Zinc Blende (ZB)/FCC crystal orientations, which can form uniform crystal morphologies and highly ordered and well defined epitaxial SE/M interfaces between the semiconductor (SE, e.g. InAs) and the metal (M, e.g. Al), which can be seen in FIGS. 1 and 2. However, the nanoscale device can be realized with other material combinations with similar structures and lattice spacings. For relevant FCC metals this could for example be Au and Ag, and for semiconductors this is for example the other members of the '6.1 Å family': GaSb and AlSb. Hence, high quality epitaxial growth of contacts to elongated crystalline nanostructures can therefore be realized with many material combinations.

As also demonstrated herein electrical devices have been provided using the presently disclosed nanoscale devices. They have been characterized at low temperature confirming the high quality of the first facet layer (shell) and a barrier-free contact between the shell and the core due to the remarkable epitaxial match between the InAs nanowire core and the Al shell, both on single facets and multiple facets. These epitaxially matched interfaces can be regarded as the ultimate limit of metal contacts to semiconductors. The hybrid nanowires thus provide a conceptually new route towards nanowire electronics as it solves the general problem of forming electrical nanowire/metal contacts.

Many present and future applications of superconductivity would benefit from electrostatic gate control of carrier density which is a characteristic of semiconductors. Topological superconductivity can be realized with electrostatic gate control of the carrier density and this can provide a basis for topological quantum information processing. Hence, there has been tremendous interest in topologically non-trivial solid state matter. These materials have a number of unique properties, including the possibility to observe and manipulate Majorana bound states which have been proposed as the basis for future fault tolerant quantum computation. A break-through in the search for Majorana fermions was the realization that under certain conditions, conventional superconductors can induce a topological non-trivial superconducting state in semiconductor nanowires. Proposals based on proximity effect in semiconductor nanowires with strong spin-orbit are appealing because the key ingredients are known in the art [8, 9]. However, all previous instances of proximitized semiconductors show significant tunneling conductance below the superconducting gap, suggesting a continuum of subgap states that nullifies topological protection—an unsolved issue referred to as the "soft gap problem". Such soft-gaps will induce decoherence of Majorana qubits, and has been considered a major road-block for the future of topological quantum information in such devices. It turns out that the hardness of the induced superconductivity depends crucially on the quality and uniformity of the semiconductor/superconductor (SE/SU) interfaces. This situation is analogous to that of conventional semiconductor devices where the quality of the involved interfaces is the primary parameter determining the performance. For this reason, semiconductor technology was revolutionized by the invention of epitaxial growth of heterostructures, which enables atomic-scale design of semiconductor interfaces and tailor-made profiles of the electronic band structures, doping levels and strain. So far, however, the world of semiconductor epitaxy has had little to do with the world of superconductivity.

But as demonstrated herein in example 3: for temperatures below the superconducting transition temperature aluminum becomes superconducting and the Al shell induces a superconducting gap into the InAs by virtue of the proximity effect. In contrast to all previous studies, however, the induced gap remains hard i.e., free of sub-gap states, likely due to the perfectly uniform InAs//Al interface. The presently disclosed nanoscale device therefore provides a solution to the soft-gap problem, because a hard superconducting gap induced by proximity effect in a semiconductor, is demonstrated by using epitaxial Al—InAs superconductor-semiconductor hybrid nanowires. The hard induced gap, along with favorable material properties and gate-tunability, makes the presently disclosed nanoscale devices attractive for both conventional and topological superconducting qubits and other potential applications, as well as fundamental studies of mesoscopic superconductivity, and the presently disclosed hybrid structures thereby remove a main obstacle for using semiconductor nanowires as the backbone in future schemes of topological quantum information based on Majorana Fermions. In this context it is noted that the InAs//Al epitaxial hybrids fulfill all basic requirements remaining for use in Majorana devices: strong spin-orbit coupling, large critical parallel magnetic field, and gate-tunability.

In one embodiment the nanostructure of the presently disclosed nanoscale device is an elongated hybrid nanostructure comprising a crystalline semiconductor nanostructure and wherein the first facet layer is a crystalline structured layer of a of superconductor material and wherein the crystalline structure of the semiconductor nanostructure is epitaxially matched with the crystalline structure of the first facet layer on the interface between the two crystalline structures. The epitaxial match between the crystalline structures of the semiconductor nanostructure and the first facet layer is preferably configured to induce a superconductor hard gap in the semiconductor nanostructure, i.e. by virtue of the superconducting properties and proximity of the first facet layer, i.e. at a temperature below the critical temperature of the superconductor material of the first facet layer. Preferably each two-dimensional interface between a plane surface of the nanostructure and the first facet layer is domain matched and/or lattice matched in at least one dimension, or at least two dimensions.

In this example, the InAs core was grown in the [0001]wz direction and the crystal orientation of the Al along the whole length of the nanowire is with the high symmetry and low energy (111) orientation normal to the interface.

Figure 2:
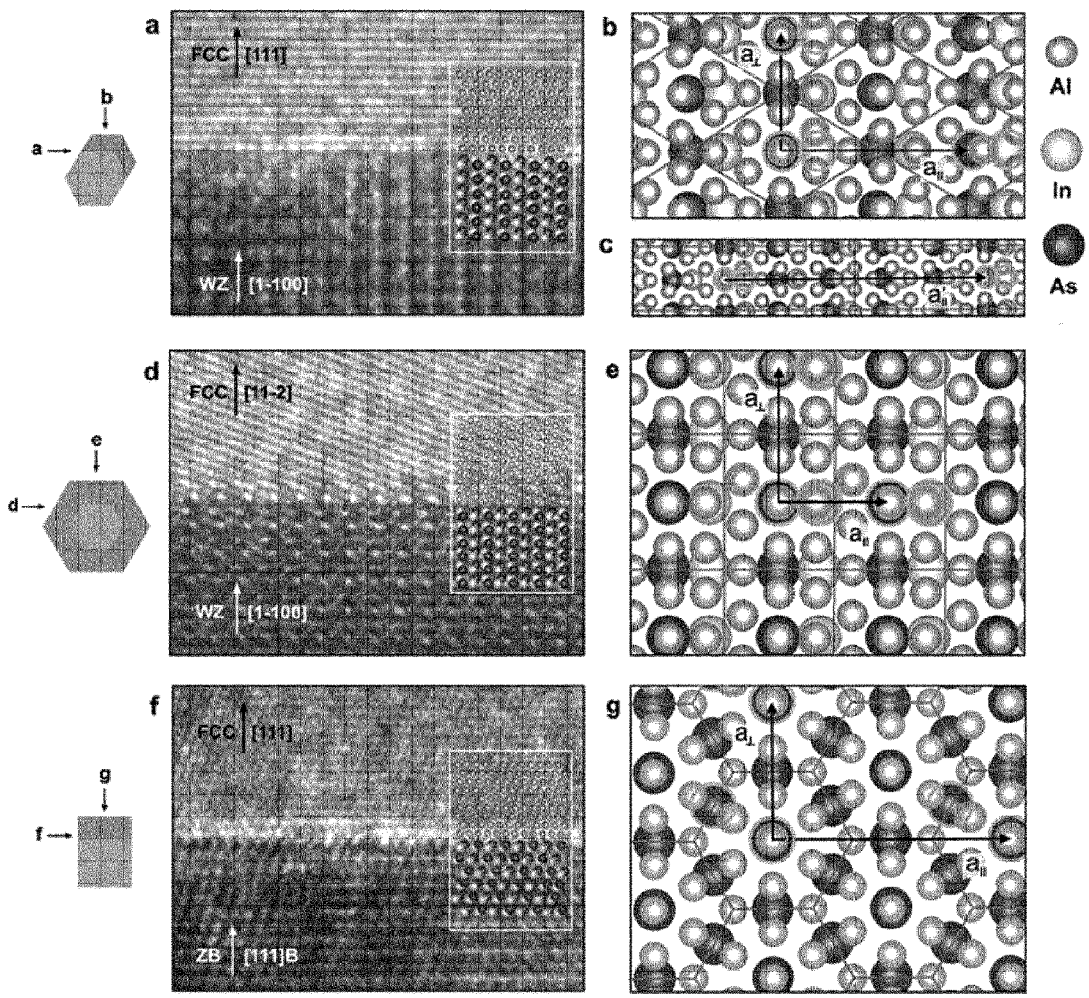

FIG. 2. Domain matched InAs//Al interfaces. Three types of dominant epitaxial bicrystal matches formed in three types on nanowire hybrid devices. The TEM images (a, d, f) are parallel views on the InAs//Al interface along the transverse $\perp$ direction, where the atomic positions in the case of a perfect flat interface are simulated in the white boxes. The right column (b, c, e, g) show simulations of normal views on the interface. The red nets are primitive domains (assuming a perfect domain match), where the highlighted atoms specify one interfacial unit of each constituent in the parallel and transverse directions (shown with vectors).

Figure 3:
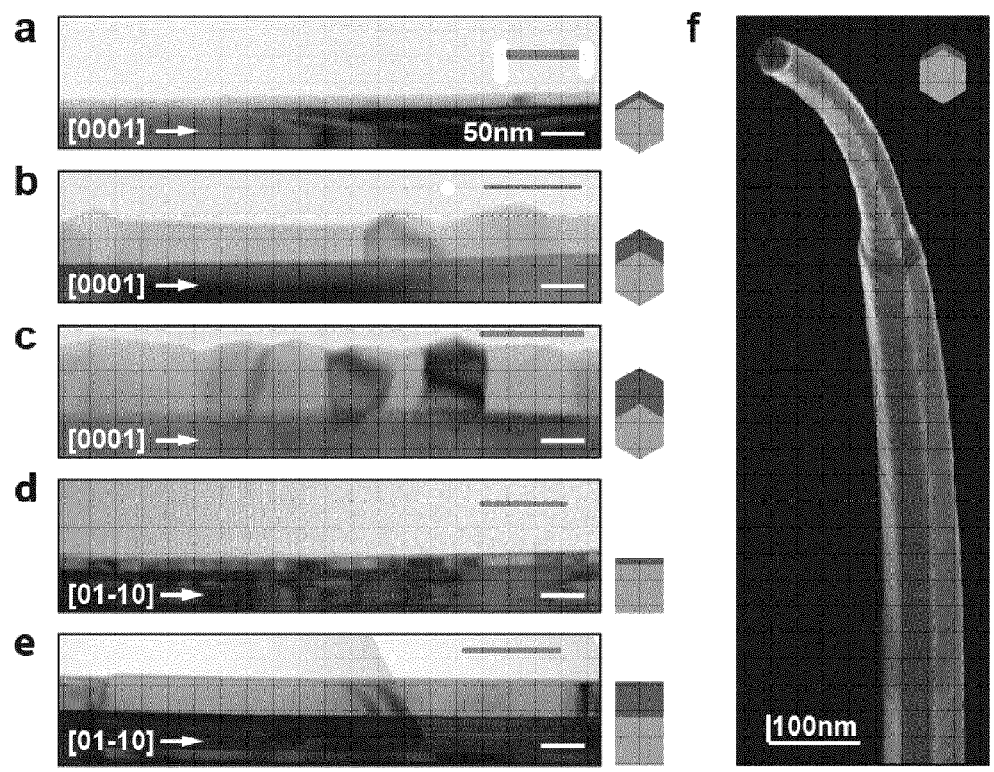

FIG. 3. Aluminum shell morphology and asymmetric strain. TEM images of different types of half-shell hybrid devices with varying shell thicknesses. In a-c the InAs core was grown along the $[0001]_{WZ}$ direction, where a structural transition from $\{111\}$ to $\{11\text{-}2\}$ out of plane orientation is observed for critical thickness beyond $r_{SU} \approx 20$ nm. In d-e the InAs core was grown along the $<1\text{-}100>_{WZ}$ direction and the shell remains uniform with $\{111\}$ out of plane orientations. Scale-bars in a-e are 50 nm. f Tilt view SEM close-up of a type-1 half-shell nanowire demonstrating the asymmetric strain induced by the Al on the InAs core, which causes nanowire to bend towards the Al due to the residual Al//InAs interfacial domain mismatch, as discussed below.

Figure 4:
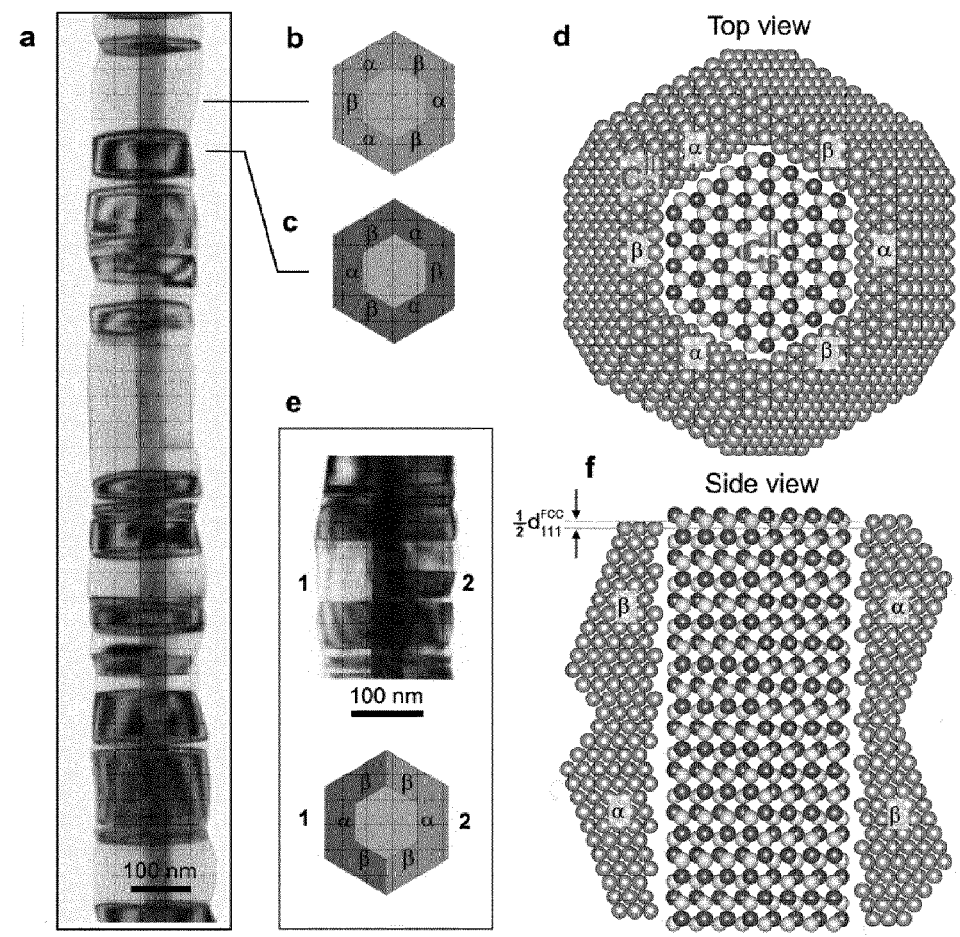
Figure 4:
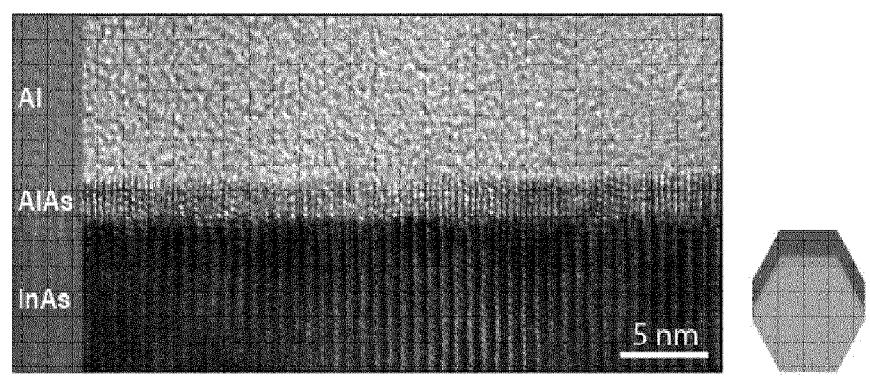

FIG. 4: Full shell epitaxial bicrystal match a) A TEM image of InAs nanowire (seen as the dark core) with a thick layer of epitaxial Al grown on all six $\{1\text{-}100\}$ facets, for which the dominating out-of-plane grain orientation is of the $\{11\text{-}2\}$ type. The two-fold degeneracy of the interface gives two variants α and β. These orientations which are seen by the TEM diffraction contrast in a, form a coherent twin along the nanowire axis as indicated in b and c. d is simulation of a full single crystal shell viewed long the nanowire axis, with alternating variants. If the same Al variants of the $\{11\text{-}2\}$ type (indicated with m'=1) are formed on adjacent facets of the InAs nanowire, they will form an incoherent grain boundary when they merge, as in the case shown in e. which is because Al does not have 6-fold symmetry, as in the InAs host. However, because a β variant corresponds to a six-fold operation of α, they can merge and form a single crystal across adjacent facets. This means that the coherent interface shown in FIG. 2b, can be produced all around the InAs nanowire, where every second interface differs by only a screw axis translation indicated in the side view simulation in f.

FIG. 4g Growth of a AlAs barrier between InAs and Al. TEM micrograph of a 3 nm AlAs high band-gap semiconductor layer separating the InAs core from the Al outer shell. The rightmost icon illustrates the type of nanowire device it is formed in.

Figure 5:
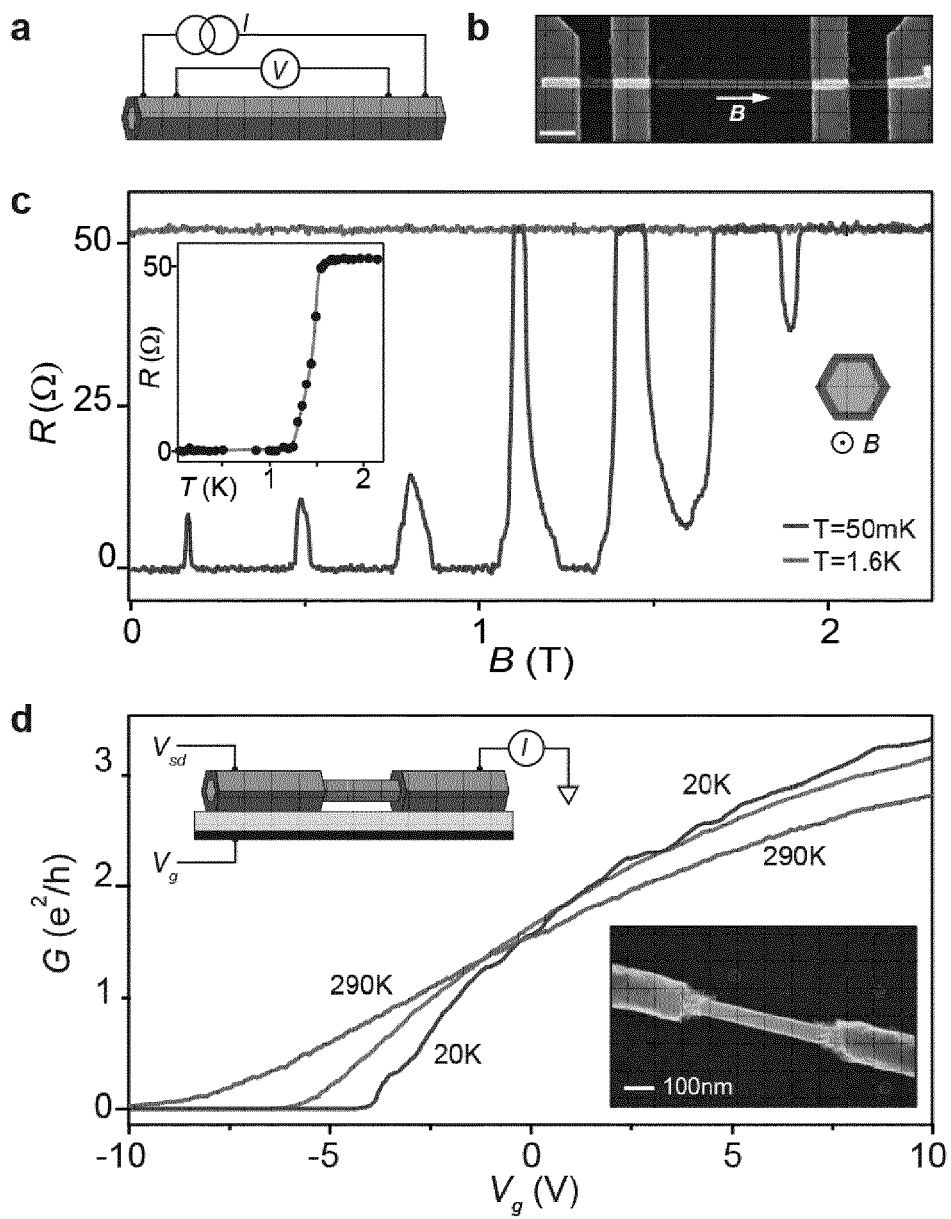

FIG. 5 Electrical properties of the InAs/Al epitaxial hybrids.
- a Illustration of a four-terminal device made from a full-shell InAs/Al nanoscale device with a 13 nm Al full-shell.
- b SEM image of the device. The scale bar is 0.5 μm and the parallel orientation of the magnetic field is indicated.
- c Measurements of the four-terminal resistance as a function of magnetic field. The nanoscale device is superconducting at low fields with Little-Parks peaks appearing at half multiples of flux quanta threading the wire. Inset shows the resistance as a function of temperature with a superconducting transition at ~1.4 Kelvin.
- d Conductance as a function of gate-voltage for a device where the InAs core has been exposed. Measurements are shows for various temperatures to investigate the contact barriers between the core and the shell. Upper inset shows a schematic of the sample, and the lower inset shows an SEM micrograph of the central part of the actual device.

Figure 6:
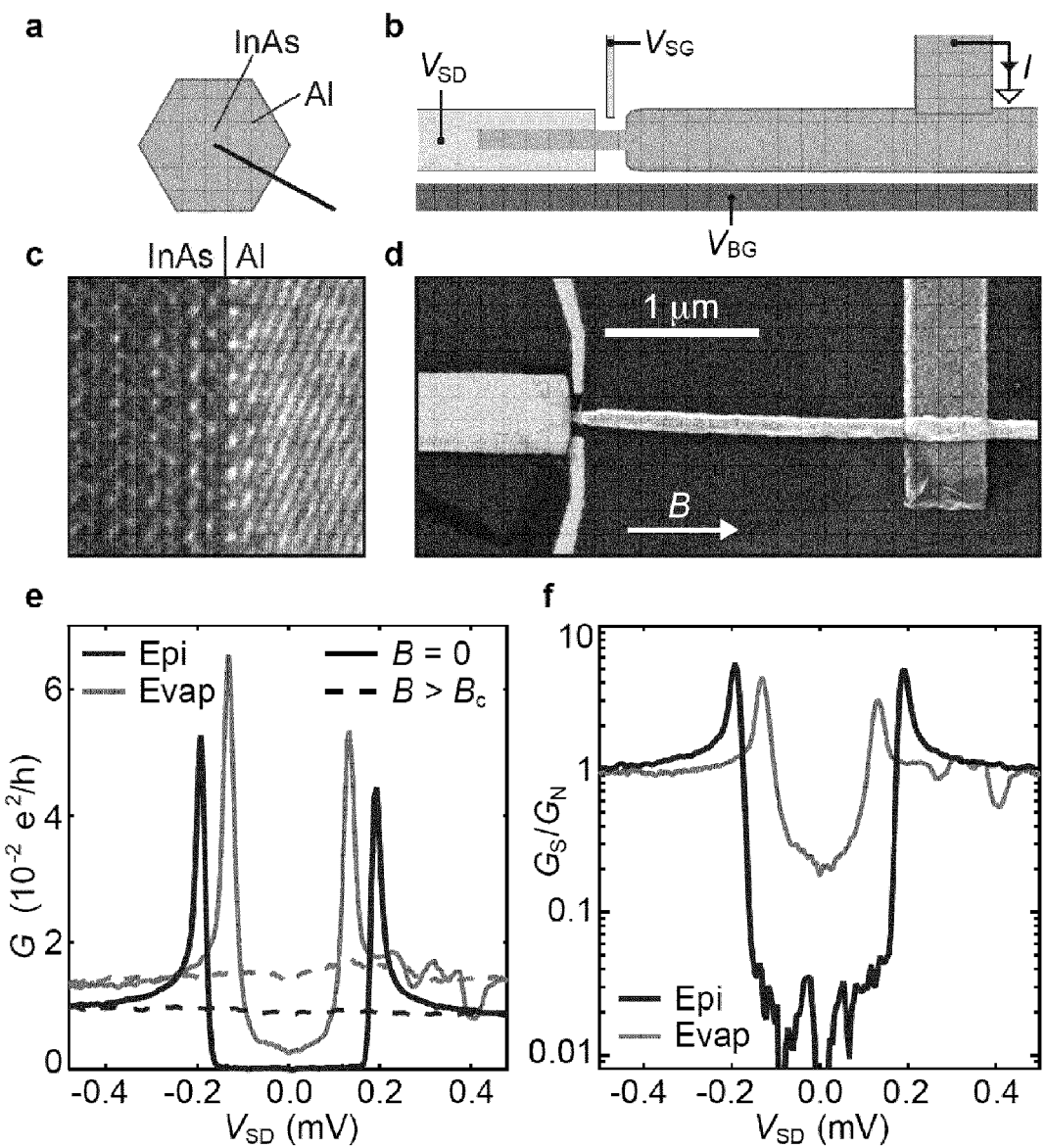

FIG. 6: Epitaxial full-shell nanoscale device and hard induced gap
- a, Cross-section schematic of an epitaxial full-shell nanowire.
- b, Measurement set-up. Yellow represents normal metal (Au), green InAs, and gray superconductor (Al).
- c, TEM image of epitaxial N—S interface.
- d, False colored SEM micrograph of a lithographically similar device.
- e, Differential conductance as a function of source-drain voltage of an epitaxial full-shell device (blue) and an evaporated control device (red). Solid lines represent data at zero magnetic field while dashed lines represent data at fields above the critical magnetic field, Bc.
- f, Normalized differential conductance. Epitaxial full-shell nanowires exhibit a subgap conductance suppression of up to two orders of magnitude.

Figure 7:
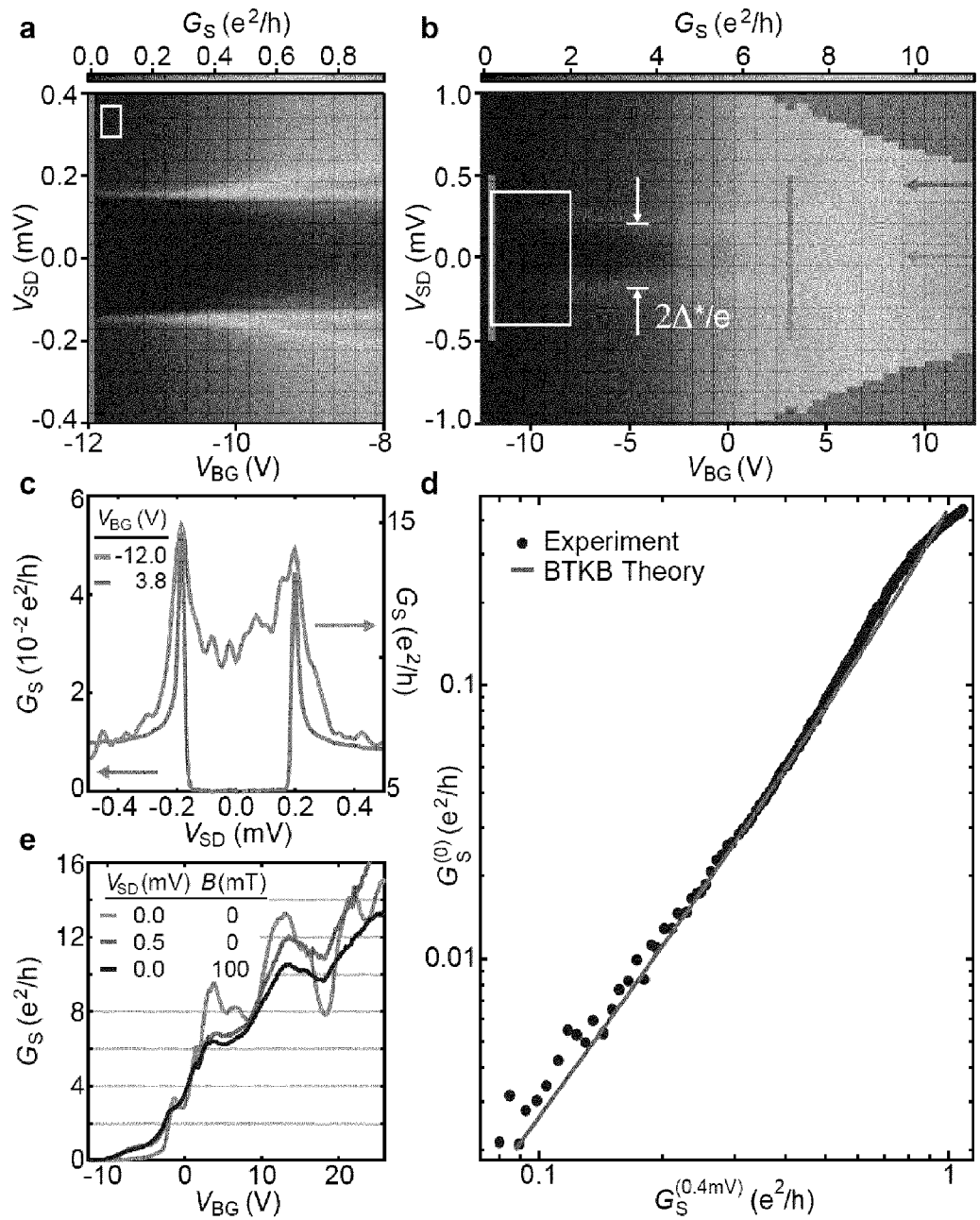

FIG. 7: Conductance of ballistic one-dimensional N—S junction in epitaxial full-shell device.
- a, b, Differential conductance of a full-shell device as a function of backgate, VBG, and VSD.
- c, Vertical cuts of a and b in the tunneling (orange), and open (blue) regimes.
- d Zero-bias versus finite-bias (0.4 mV) conductance. The solid line (red) represents the theoretical relation between the two quantities.
- e, Conductance steps as a function of VBG at zero-bias, above-gap bias, and normal state (B=100 mT>Bc).

Figure 8:
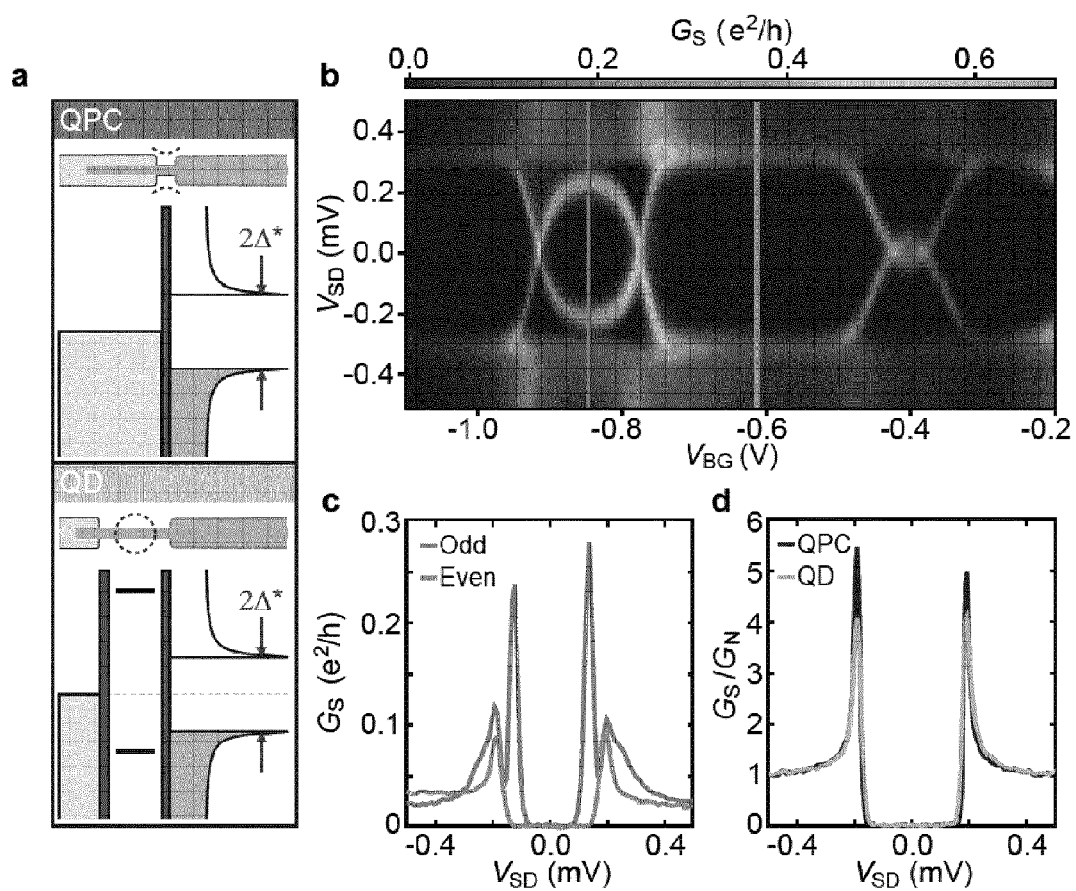

FIG. 8: Epitaxial full-shell quantum point contact vs quantum dot devices.
- a, Tunneling spectrum of a proximitized InAs core coupled to a QPC (upper panel) and QD (lower panel).
- b, Andreev bound states in a quantum dot. The green (orange) line indicates the particle-hole symmetry point of an even (odd) Coulomb diamond.
- c, Vertical cuts of b.
- d, Comparison of tunneling measurements between a QPC device and a QD device in an even valley.

Figure 9:
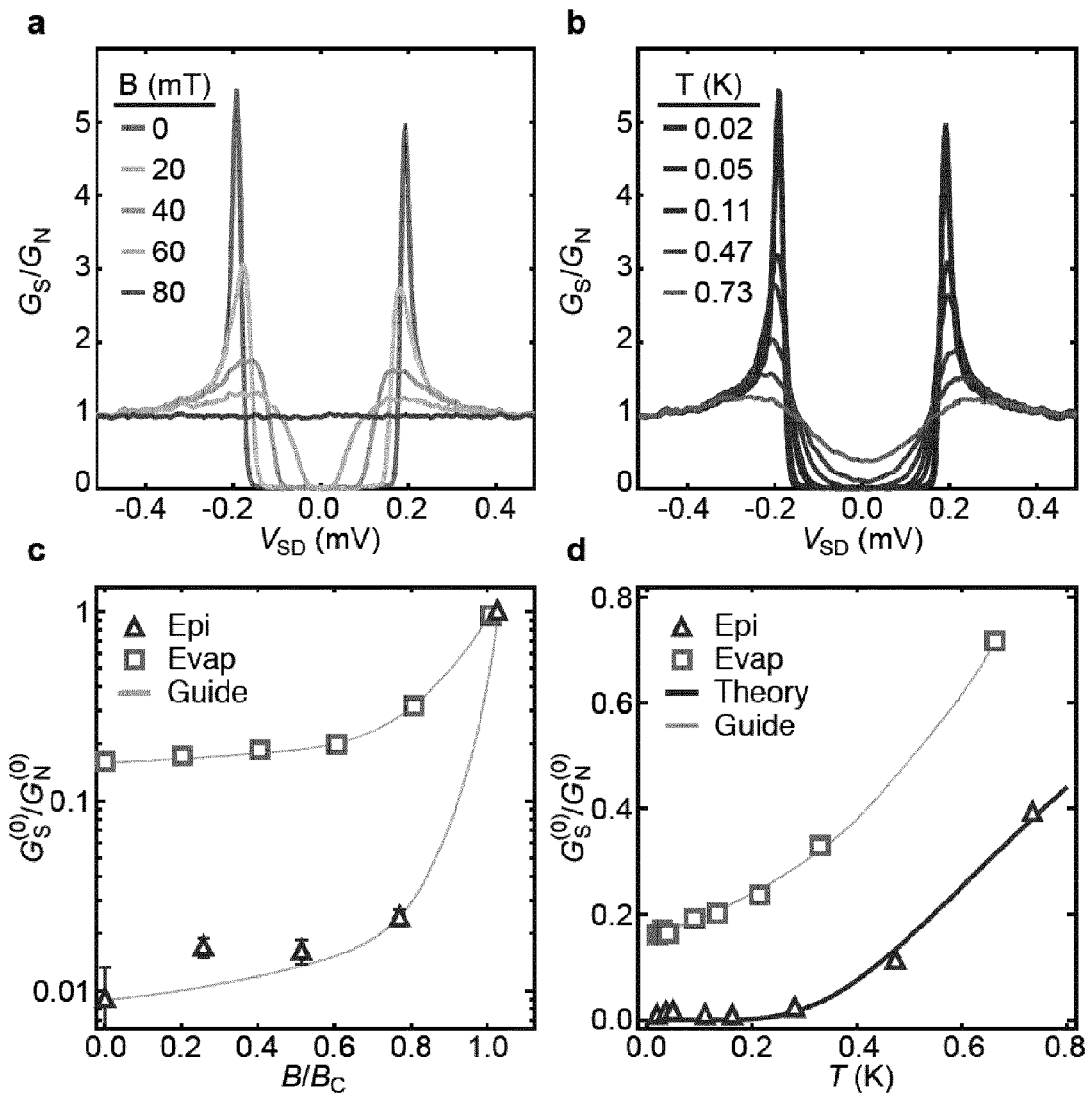

FIG. 9: Magnetic field and temperature dependence of induced gaps.
- a, Magnetic field dependence of an epitaxial fullshell device.
- b, Temperature dependence of an epitaxial full-shell device.
- c, Comparison of normalized zero-bias conductance between the epitaxial device and a control device as a function of normalized magnetic field.
- d, Comparison of normalized zero-bias conductance between the epitaxial device and an evaporated control device as a function of temperature. Gray lines in c and d are guides to the eye, and the blue line in d is a theoretical fit to the data.

Figure 10:
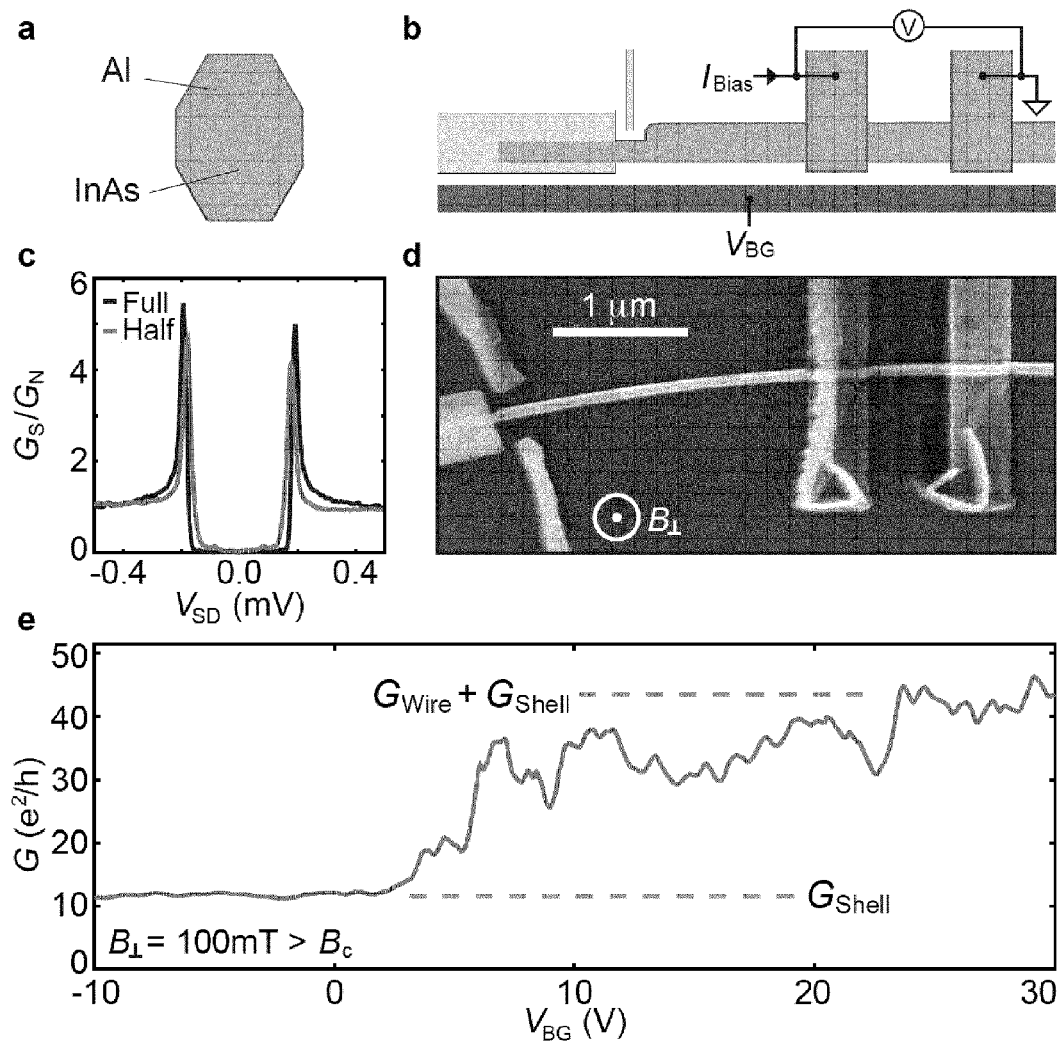

FIG. 10: Epitaxial half-shell device and gate-tunability of InAs core
- a, Cross-section illustration of a half-shell nanowire.
- b Gate-tunability measurement schematic of a half-shell nanowire device.
- c, Comparison of induced gap quality between an epitaxial full-shell and half-shell device.
- d, SEM micrograph of a lithographically similar device.
- e, conductance of the Al shell and InAs core as a function of VBG.

Figure 11:
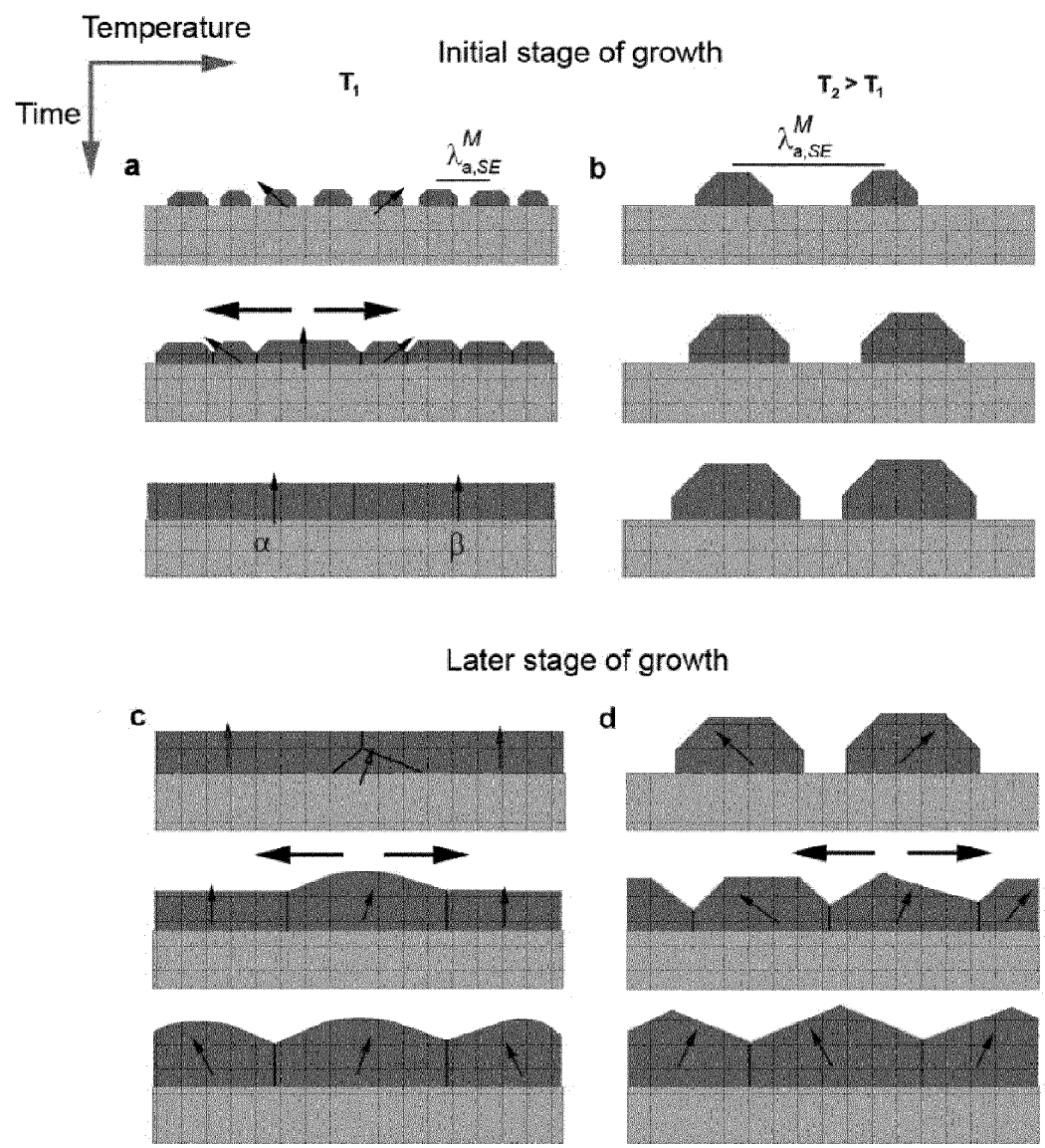

FIG. 11 Main stages during epitaxial grain growth.
- a,b An illustration of the initial stages of the metal growth evolution at relatively low and high temperatures.
- In a, a low substrate temperature $T_1$ gives small and closely spaced metal grains due to a relatively low adatom mobility, described by an average adatom diffusion length $\lambda_{a,M}^{SE}$ of species M on a facet of SE. The small grains will merge into a thin film, where if the film is thin enough, the grains with the lowest surface energy will grow on expense of the grain with higher surface energy (as indicated by the arrows).
- In b, $\lambda_{a,M}^{SE}$ is larger due to a higher temperature, $T_2$, which give larger grains separated further apart.
- c, d Continuing growing, the both temperature regimes may evolve into new preferred crystal orientations as the role of the grain boundaries and strain contributions becomes increasingly important with increasing film thickness.

Figure 12:
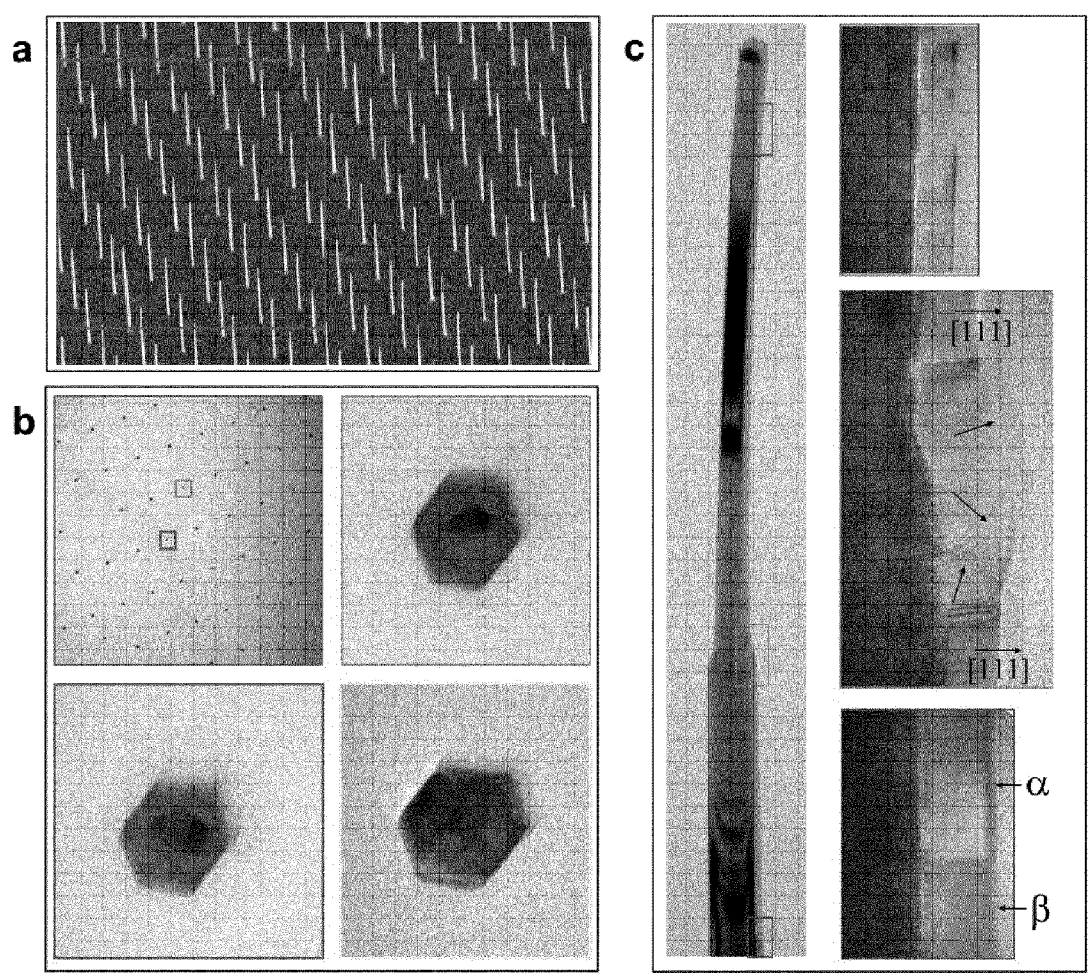

FIG. 12 Two-facet thin shell Al/InAs NWs.
- a A SEM image of an array of InAs NWs with 10 nm of Al grown on two facets.
- b A TEM image of a cross sectional cut through the NW array (in a region similar to the square blue region in a) which was cut out using a Ultra-Microtome system. Three examples of individual wires are shown in higher resolution and marked with corresponding squared colour boxes. The Al is sitting to two facets, which is seen by the light grey contrast at the two top-right facets.
- c A TEM image of a single NW from the same growth as in a and b, where the [111] out of plane orientation is seen all along the NW except where the change its diameter (green region). This is seen in the high resolution TEM images indicated by the blue and red regions. In the red region both variants, α andβ of the [111] out of plane orientation is shown (these are the only two variants of this type of interface according to equation (0)). In the green region the NW surface is rough and the orientation of the Al phase gets mixed with no clear orientation, indicated by the arrows pointing in various [111] directions.

Figure 13:
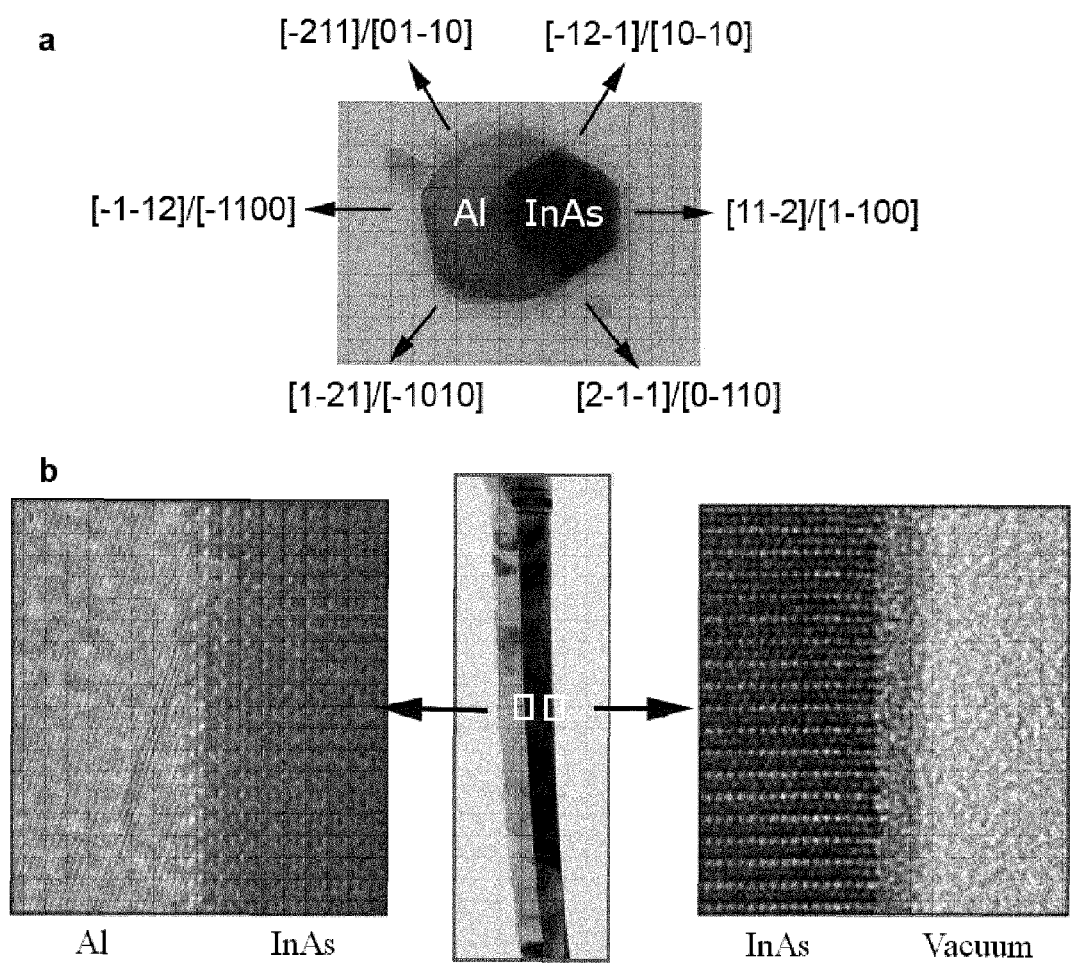

FIG. 13: 'Thick' three-facet shell of Al grown on the InAs NW sidefacets.
  a Topview cross sectional TEM image along the NW axis, where the dominating faceting in the Al crystal follows the faceting of the InAs.
  b Sideview TEM image, where the high resolution epitaxial match at the InAs/Al interface is seen to follow the $\{11\text{-}2\}//\{1\text{-}100\}$ coherent type. This corresponds well to the faceting seen in a, which suggests that the growth was terminated in the grain boundary driven growth mode according the to the discussion in S1 and S2.

Figure 14:
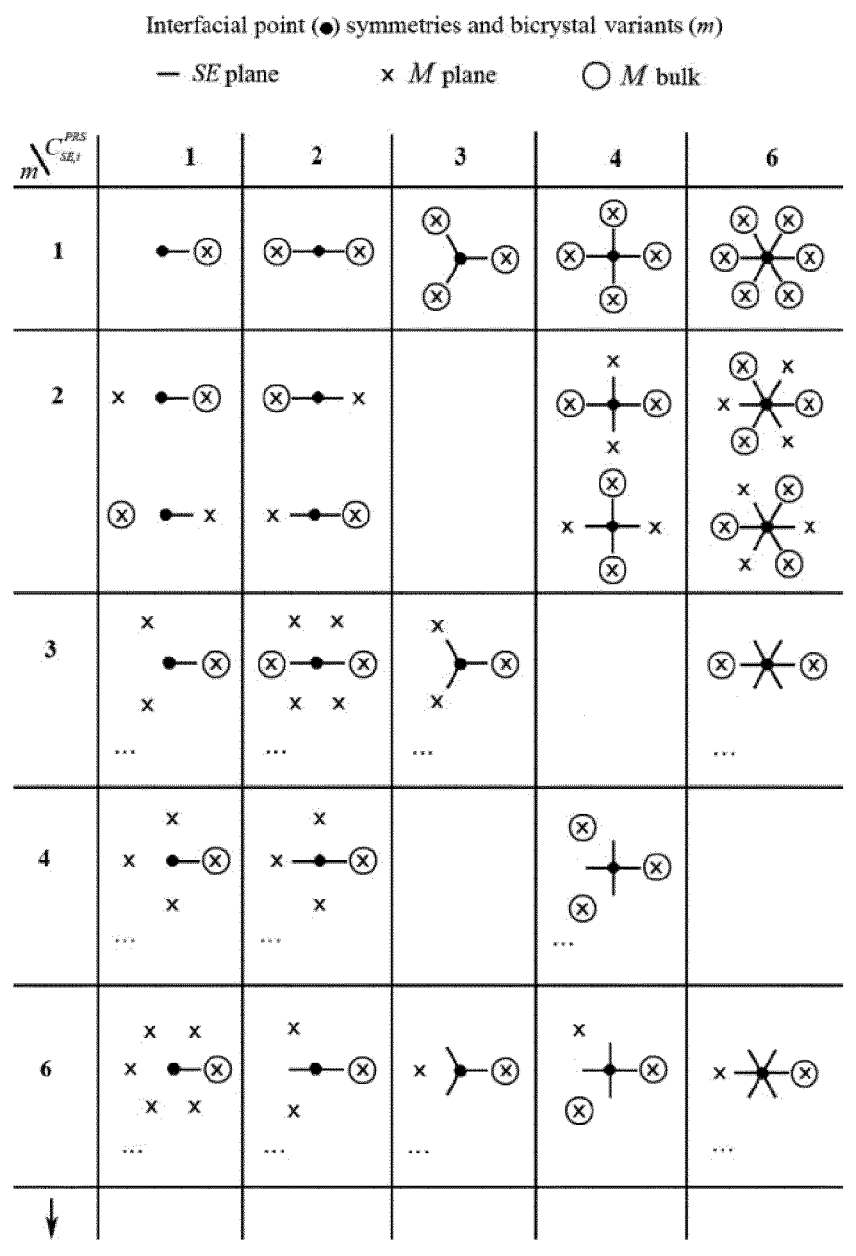

FIG. 14 Examples of symmetry diagrams of single plane bicrystals. The SE plane symmetry is a fixed reference, while the M plane and bulk symmetry rotates around a point normal to the interface. If a given rotation gives the same plane symmetry but different bulk configuration, it is a variant, or specified in another way: the number of different M bulk orientations for a given interface pattern defines the number of degenerate variants, in this single plane symmetry limit.

Figure 15:
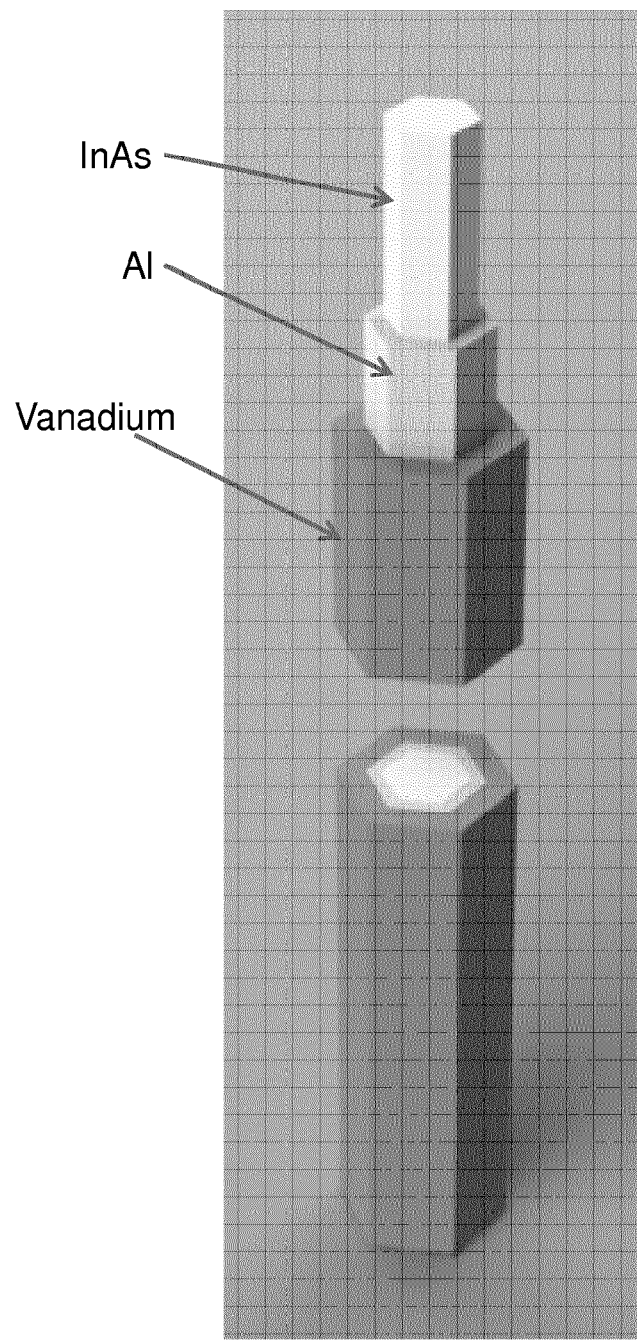

FIG. 15 Illustrates the principle of depositing a second facet layer on to the (first) facet layer, in this case a layer of vanadium has been deposited onto a full shell hybrid nanoscale device with InAs/Al.

Figure 16:
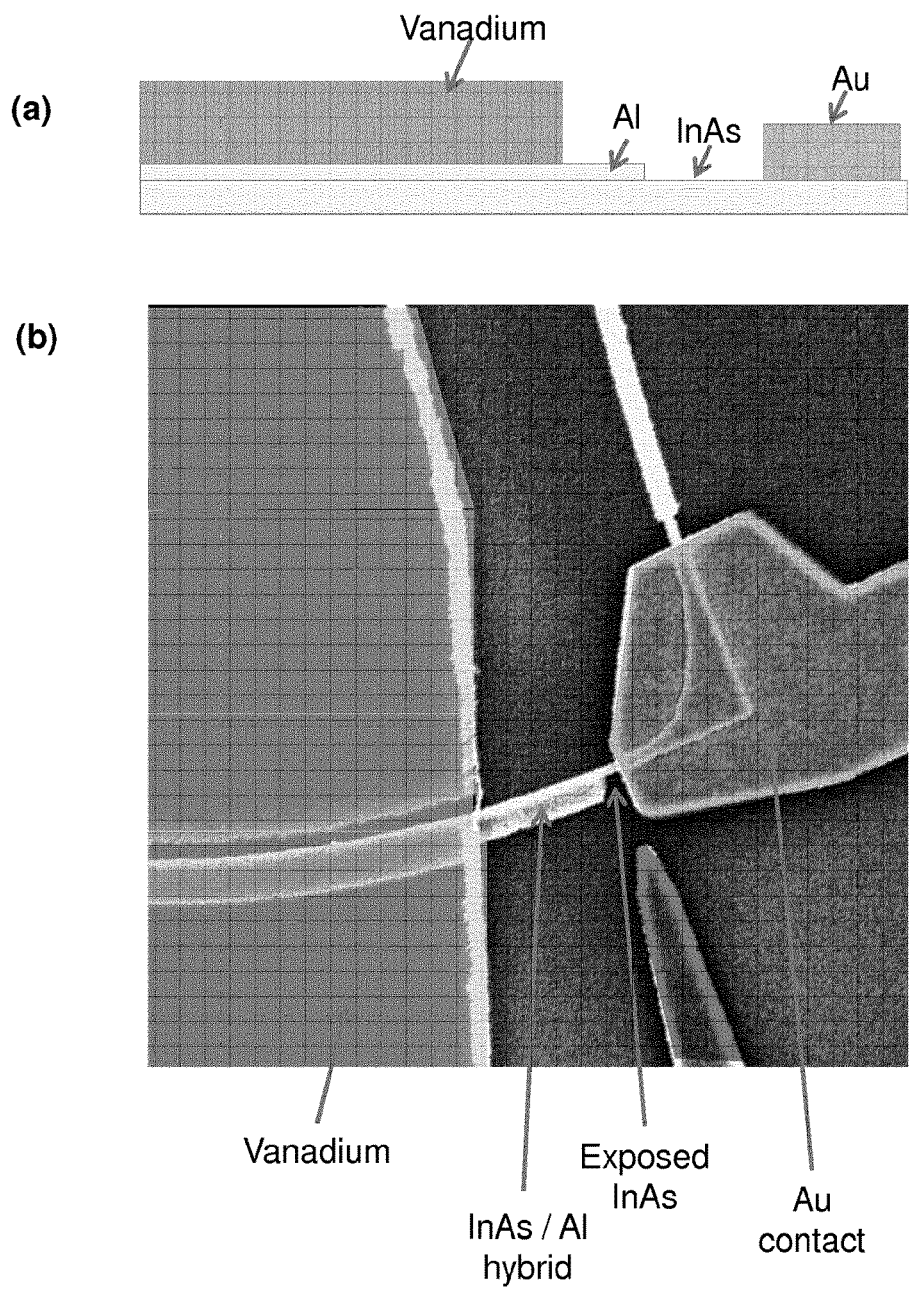

FIG. 16a Illustrates the schematic principle of an actual device with two facet layers and a gold contact.

FIG. 16b Shows a picture of an actual device with two facet layers and a gold contact.

Figure 17:
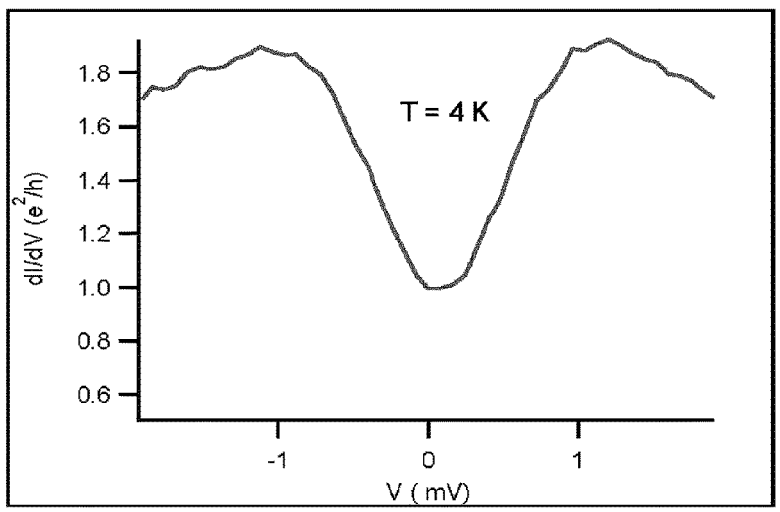
Figure 17:
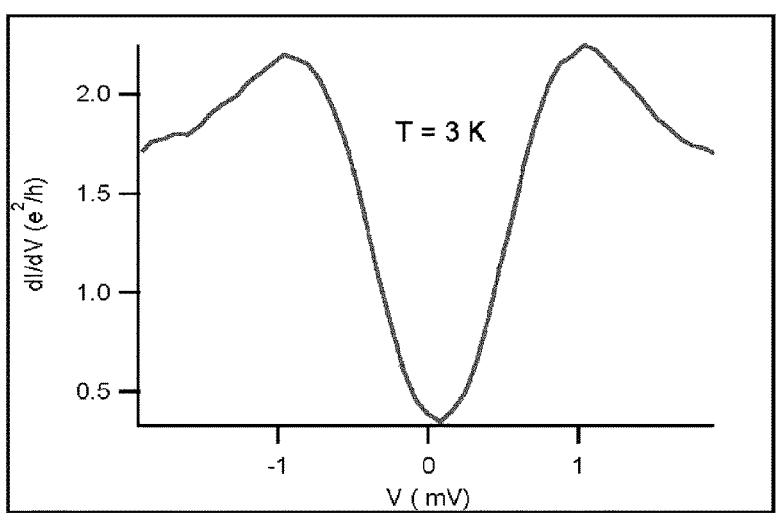
Figure 17:
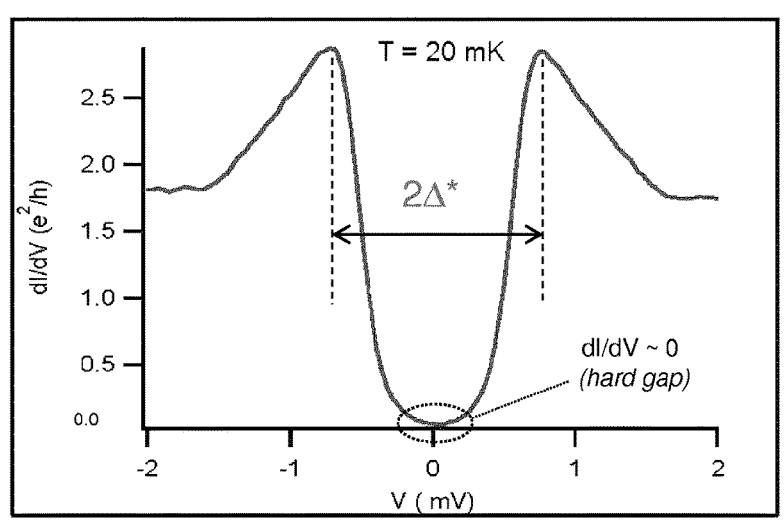

FIG. 17 Measurements of the gap properties of the device in FIG. 16b.

FIG. 18 contains a table listing domain matching for InAs with different cubic metals in the [11-2] out-of-plane orientation.

FIG. 19 contains a table listing domain matching for InSb with different cubic metals in the [11-2] out-of-plane orientation.

FIG. 20 contains a table listing domain matches for GaAs with different cubic metals in the [11-2] out-of-plane orientation.

DETAILED DESCRIPTION OF SPECIFIC EMBODIMENTS

As stated previously the present disclosure relates to a nanoscale device comprising an elongated crystalline nanostructure, such as a nanowire (crystal) or nanowhisker (crystal) or nanorod (crystal), having a plurality of substantially plane side facets and a first facet layer covering at least a part of one or more of said side facets. The terms "nanowire" and "nanowire crystal" may be used interchangeably" herein, as it may be implicitly disclosed that the nanowires mentioned herein are crystalline structures.

Naturally the first facet layer may crystalline. The two-dimensional interface between a side facet of the crystalline nanostructure and the first facet layer may be epitaxial. Even further the two-dimensional interfaces between each side facet of the crystalline nanostructure and the first facet layer may be epitaxial, such as simultaneously epitaxially matched. Thus, the crystalline structure of the nanostructure may be epitaxially matched with the crystalline structure of the first facet layer. As also stated previously each two-dimensional interface between a side facet of the crystalline nanostructure and the first facet layer may be domain matched and/or lattice matched in at least one dimension, preferably in both dimensions. Thus, in one embodiment each two-dimensional interface between the side facets of the crystalline nanostructure and the first facet layer is simultaneously epitaxially matched, domain matched and lattice matched in both dimensions.

Epitaxial match in the interface between two crystalline layers may not be entirely unusual if the crystal structures of the two crystalline layers are equal. However, in this case the inventors have demonstrated that an epitaxial interface can be realised even when the crystal structure (and/or crystal phase) of the elongated crystalline nanostructure is different from the crystal structure (and/or crystal phase) of the first facet layer, such as when the crystal structure (and/or crystal phase) of the elongated crystalline nanostructure and the crystal structure (and/or crystal phase) of the first facet layer belong to different lattice systems and/or if the Bravais lattice of the elongated crystalline nanostructure is different from the Bravais lattice of the first facet layer. If for example the crystal structure of the elongated crystalline nanostructure is zincblende (ZB) then the crystal structure of the first facet layer is not zincblende, i.e. the crystal structures are different. Correspondingly if for example the crystal structure of the elongated crystalline nanostructure is wurtzite then the crystal structure of the first facet layer is not wurtzite, i.e. the crystal structures are different. E.g. the crystal structure of the elongated crystalline nanostructure may be zincblende (ZB) or wurtzite (WZ) and the crystal structure of the first facet layer belongs to the cubic crystal system, such as primitive cubic, BCC or FCC, as demonstrated herein with InAs nanowires (ZB or WZ) with an Al (FCC) epitaxially matched facet layer.

In further embodiment the first facet layer comprises one or more large single crystal segments wherein the interface between the elongated crystalline nanostructure and said single crystal segment(s) is epitaxially matched, such as simultaneously epitaxially matched on all side facets.

In one embodiment the elongated crystalline nanostructure is branched, e.g. formed from branched nanowhisker crystals. E.g. the elongated crystalline nanostructure may comprise one or more kinks.

The elongated crystalline nanostructure may be homogeneous, i.e. formed from the same compound material in the longitudinal/axial direction and/or in the radial direction. However, the elongated crystalline nanostructure may in itself be a heterogeneous structure, e.g. a heterostructured nanowire crystal. E.g. the crystalline nanostructure may be a heterostructured nanowire crystal composed of different compounds in the axial and/or radial direction.

As previously stated it is unusual that an epitaxial interface is provided between layers having different crystal structures and this opens for epitaxial interfaces between semiconductors (which are often wurtzite or zincblende) and metals (which are often BCC or FCC). In one embodiment the first facet layer is hence a metal selected from the group of Al, Ne, Ar, Ca, Ni, Cu, Kr, Sr, Rh, Pd, Ag, Xe, Ce, Yb, Ir, Pt, Au, Pb, Ac, Th, Li, Na, K, V, Cr, Fe, Rb, Nb, Mo, Cs, Ba, Eu, Ta and W. Some of these metal become superconducting below a critical temperatures. However, facet layers of other materials may as well be provided where an epitaxial interface to the elongated crystalline nanostructure can be realised, e.g. selected from the group of high temperature ceramic superconductors, such as copper oxide or cuprate superconductors, which are often having a perovskite crystal structure.

The cross-section of the elongated crystalline nanostructure may e.g. be square, hexagonal, or octagonal providing a total of four, six or eight side facets, respectively. Consequently, the first facet layer may be covering at least a part of 1, 2, 3, 4, 5, 6, 7, 8 or more of the side facets.

The thickness of the first facet layer may be less than 300 nm, or less than 250 nm, or less than 200 nm, or less than 150 nm, or less than 100 nm, or less than 90 nm, or less than 80 nm, or less than 70 nm, or less than 60 nm, or less than 50 nm, or less than 45 nm, or less than 40 nm, or less than 35 nm, or less than 30 nm, or less than 25 nm, or less than 20 nm, or less than 19 nm, or less than 18 nm, or less than 17 nm, or less than 16 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm.

At the initial stage of the growth of the first facet layer islands may form at the elongated crystalline nanostructure surface. During this growth the temperature of the substrate may play an important role with regard to the spacing between the islands. If the temperature is low enough, the spacing is so small that the islands will merge at a very thin thickness of the first facet layer. As discussed further below this may lead to surface driven grain growth. A thickness of the first facet layer below 15 nm may only be obtained if the temperature during growth/deposition of the first facet layer is below −20° C., or below −25° C., or even below −30° C.

The diameter of the elongated crystalline nanostructure may be between 10 and 200 nm, such as between 10 and 20 nm, or between 20 and 30 nm, or between 30 and 40 nm, or between 40 and 50 nm, or between 50 and 60 nm, or between 60 and 70 nm, or between 70 and 80 nm, or between 80 and 90 nm, or between 90 and 100 nm, or between 100 and 110 nm, or between 110 and 120 nm, or between 120 and 140 nm, or between 140 and 160 nm, or between 160 and 180 nm, or between 180 and 200 nm.

The length of the elongated crystalline nanostructure may be between 1 and 20 μm, or between 1 and 2 μm, or between 2 and 3 μm, or between 3 and 4 μm, or between 4 and 5 μm, or between 5 and 6 μm, or between 6 and 7 μm, or between 7 and 8 μm, or between 8 and 9 μm, or between 9 and 10 μm, or between 10 and 12 μm, or between 12 and 14 μm, or between 14 and 16 μm, or between 16 and 18 μm, or between 18 and 20 μm.

Method

The present disclosure further relates to a method for producing a nanoscale device. Basically elongated crystalline nanostructures may be grown at elevated temperatures, e.g. above 300° C., above 350° C., or above 400° C., e.g. in the normal direction on a plane substrate. Importantly the first facet layer is grown/deposited directly on at least one side facet of the elongated crystalline nanostructures at a much reduced temperature compared to what has previously been tried, e.g. below 50° C. or below 20° C. To provide a thin facet layer, e.g. on the order of 10 nm, the temperature can be reduced even further, i.e. below 0° C., or below −5° C., or below −10° C., or below −15° C., or below −20° C., or below −25° C., or most preferably below −30° C., during deposition of the first facet layer. The reduction in temperature may also help to prevent any material sticking at the nanowire surface before the first facet layer is deposited. An oxide free interface between the side facets and the first facet layer is thereby obtained, i.e. an oxide free epitaxial interface/contact between a semiconductor nanowire and a metal (or a superconductor) can be obtained, as demonstrated herein, where nanowires grown in the conventional $[0001]_{WZ}/[111]_{ZB}$ direction have a first facet layer in the form of a cubic metal phase with the [11-2] normal to the side facets of the nanowire and [111] along the nanowire axis. This is indeed unique because the symmetry allows large single crystal segments with simultaneous epitaxial match on all facets of the nanowire.

The inventors have realized that if the first facet layer is deposited at very low temperature it is possible to grow a first facet layer such that the two-dimensional interface between the first facet layer and the elongated crystalline nanostructure is epitaxially matched, even when the nanostructure and the first facet layer have fundamentally different crystal structures. This opens the door for epitaxial matches between semiconductors and metals on the side facets of nanostructures like nanowires, as demonstrated herein. The key issue in the growth method is the Igow temperature when depositing the first facet layer to provide for initial surface driven growth of small crystal grains of the first facet layer. Thus, after the elongated nanostructures have been grown all sources (e.g. in an MBE chamber) must be shut off such that the growth chamber is empty and then lowering the temperature, which can be lowered to below 0° C. or much lower, within seconds or minutes if external cooling sources like liquid nitrogen is used.

The background pressure may also be reduced before the provision of the first facet layer. If the process takes place in a vacuum chamber, the background pressure may be reduced. This may also help to prevent any material sticking at the nanowire surface before the first facet layer is deposited. The presently disclosed method may in one embodiment be seen as a method for producing a metallic contact and/or interface to a semiconductor elongated crystalline nanostructure (e.g. a nanowire).

One embodiment relates to a method for producing a nanoscale device comprising the steps of:
a) growing, at an elevated temperature, such as above 400° C., one or more elongated crystalline nanostructures in the normal direction on a plane substrate,
b) reducing the temperature thereby cooling the substrate with the elongated crystalline nanostructures to a temperature below 20° C., and
c) depositing, at said reduced temperature, a first facet layer directly on at least one side facet of the elongated crystalline nanostructures.

A further embodiment relates to method for producing a nanoscale device in a vacuum chamber by means of molecular beam epitaxy (MBE), the method comprising the steps of
a) growing, e.g. by means of vapour liquid solid (VLS) growth, at an elevated temperature of above 400° C., one or more elongated crystalline nanostructures, such as nanowire (crystals), in the normal direction on a plane substrate,
b) shutting off all sources of growth material and reducing the temperature thereby cooling the substrate with the crystalline nanostructures to a temperature below −30° C., and
c) depositing, at said reduced temperature, a crystalline first facet layer directly on at least one side facet of the crystalline nanostructures.

The method may be provided for production of the presently disclosed nanoscale device. The step of growing in the methods disclosed herein may therefore comprise growing the elongated crystalline nanostructure of the presently disclosed nanoscale device. Similarly the step of depositing may be the deposition of the first facet layer of the presently disclosed nanoscale device. The presently disclosed methods may furthermore comprise one or more steps of depositing the second and/or third facet layers as disclosed herein.

The method may be provided by means of MBE and growth may be provided by the vapour liquid solid growth method. Hence, the plane substrate may be located in ultra-high vacuum in a vacuum chamber, e.g. MBE chamber, and may be prepared with catalysing particles, such as Au particles, which is a normal growth method of elongated crystalline nanostructures.

In order to hit the side facet(s) of the elongated crystalline nanostructures when growing the first facet layer, the source of the first facet layer may be located at a finite angle, e.g. less than 10 deg or less than 5 deg, such as 2-3 degrees, (e.g. inside an MBE vacuum chamber) to the normal direction of the substrate during deposition of the first facet layer. In order to cover additional side facets of the elongated crystalline nanostructures the substrate may be rotated during deposition of the first facet layer.

As also stated previously the temperature of the substrate before deposition of the first facet layer may preferably be reduced to a temperature below 10° C., or below 0° C., or below −5° C., or below −10° C. or below −15° C., or below −20° C., such as below −25° C., more preferably below −30° C. These low temperatures have been realized in a standard MBE chamber by reducing the background pressure and waiting for several hours. However, the temperature may be reduced much faster by applying an external source of cooling, e.g. liquid nitrogen, to cool the substrate. Even lower temperatures for depositing/growing the first facet layer can then be reached. However, most importantly the time to reach the low temperatures can be much reduced.

The nanowire is typically at least initially grown in the vertical direction normal to the substrate. However, the growth direction of the elongated crystalline nanostructure can be kinked during growth. The growth direction may for example be kinked by means of a short flush of Ga[25] or by means of a short temperature drop during growing of the elongated crystalline nanostructure.

As an example InAs nanowires were grown in two different crystal directions on (111)B InAs substrates by the Au-catalyzed vapor-liquid-solid method in a solid-source Varian GEN-II MBE system. The first type is the conventional nanowires with an axial (0001)B wurtzite (WZ) orientation growing vertical on the substrate, with a corresponding planar growth rate of 0.5 μm/hr and a V/III ratio of ~100 for 30 minutes at a substrate temperature of 420° C. These conditions provide a pure WZ crystal structure with flat side facets. The second type is grown perpendicular to the substrate, after kinking the growth direction of the conventional nanowires into one of the six equivalent <1-100> orientations, which was obtained by either a short flush of Ga or a short temperature drop and back up again. Hereafter the substrate is cooled below −30° C., by turning of all power sources which can act as heat sources. This process may take more than 8 hours in a chamber without cooling sources. For the half shell growth the substrate rotation is disabled and the substrate is visually oriented with an accuracy of ~2-3 degrees to have the desired crystal orientation facing the Al cell. RHEED can be used as an alternative for substrate alignment.

The thickness of the metal phase on the nanowire facets is given by, $s(t) = \chi \Omega_S \sin(\varphi) \cdot f \cdot t$, where $\Omega_S$ is the atomic volume, $\varphi$ is the angle of the incoming beam with respect to the facet normal, f the incoming flux of growth species, and $\chi$ is a correction factor for the time the beam is effectively hitting the facets. The corresponding planar growth rate ($\Omega_S f \cos(\varphi)$) for the Al growth was 0.3-0.5 μm/hr. After growth the substrate can be turned away from the sources and put at room temperature in the buffer chamber, before any heat sources (power supply for substrate holder, ion gauges, light sources) are turned on in the growth chamber.

Morphological Evolution During Epitaxial Growth of a NW Metal Shell

The surface kinetics of adatoms seems to play a role in the complicated evolution of the crystal morphology when the first facet layer is grown of the side facets. A low substrate temperature during deposition of the first facet layer promotes formation of small and closely spaced islands because the adatom mobility at the nanostructure surface may be small (FIG. 11a). As the islands grow bigger, they will merge into a thin film, and if the film is thin enough when the islands merge, minimization of surface energy dictates the out-of-plane grain orientation. E.g. for most FFC metals, this will lead to flat and uniform (111) low energy surfaces (as shown for InAs/Al in FIG. 12). A higher temperature will increase the adatom mobility, which results in islands spaced further apart, as illustrated in FIG. 11b. When larger islands merge, the film may have exceeded a certain thickness where the role of primarily in-coherent grain boundaries and strain fields becomes the dominating driving forces for grain growth, and the growth may never pass through the surface driven stage. At the later stages in growth (as illustrated in FIG. 11 c, d), for both relative low and high temperatures, there can be nucleation of new preferential orientations and reconstruction of the metal phase.

Epitaxial Interfaces—Interfacial Bicrystal Symmetries and Degenerate Grain Orientations Crystalline materials with different crystal structures (e.g. many combinations of semiconductors and metals) are in general incommensurate in their relaxed states, but when put together they can have preferred relative orientations, which depend on the lattice constants and symmetries of the constituents. It is not only the interface energies that determine relative orientations but also surface and grain boundaries play an important role. Based on TEM measurements on many different types of InAs/Al NWs, it is for example clear that there exist a preferential out-of-plane orientation of the Al phase, for a given phase thickness and type of core-shell hybrid structure. Moreover, for each out-of-plane orientation there seems to be a very limited number of in-plane orientations present. The principle of epitaxial rotation of unstrained structures has previously been formulated; however, the results presented herein suggest that the interfaces try to minimize the energy by forming small domains. Thus, the in-plane high symmetry bicrystal rotations of a given out-of-plane orientation may be analysed. It turns out that orientations that differ in the bulk can have, if not identical, then almost identical interfaces, and they will therefore be regarded as degenerate (for the growth analysis). The bilayer rotational symmetries normal to the interface of two joining arbitrary crystals can be analyzed, e.g. a semiconductor SE and a metal M, where SE is considered as a fixed reference. For a given out of plane orientation of M, there exist a given number of degenerate crystal orientations, i.e. with indistinguishable interfacial planes, but with distinguishable crystal orientations in M. We will call the crystal orientations that correspond to a given type of SE/M interface for the variants of M.

The epitaxial relation and ordering of the SE/M interfaces is described in terms of domain matching. That is, when a lattice mismatch of a given SE/M material combination is large, interfacial domains—consisting of $n_M$ and $n_{SE}$ interfacial units of M and SE—form, in order to reduce the stress associated with the mismatch. We will describe a given SE/M interface with the interfacial domain notation:

$$\left(\frac{n_{M,\square}}{n_{SE,\square}},\varepsilon_\square\right)\times\left(\frac{n_{M,\perp}}{n_{SE,\perp}},\varepsilon_\perp\right),$$

where $$\frac{n_M}{n_{SE}}$$

denotes the ratio of domain units in two orthogonal directions in the interfacial plane, parallel $\square$ and transverse $\perp$ to the NW axis. $\varepsilon$ is the corresponding residual mismatch in the respective directions as expected from relaxed structures at room temperature.

Figure 1:
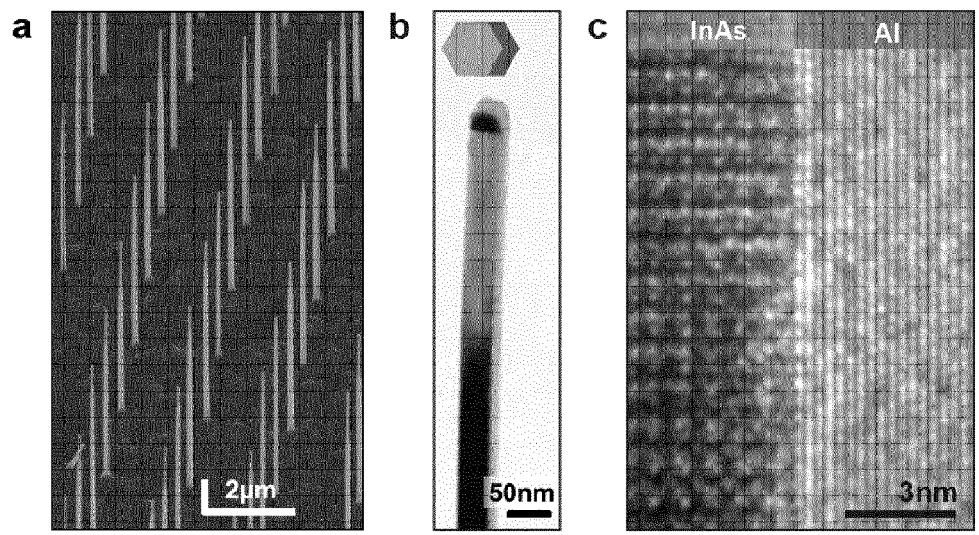
FIG. 1: Overview of an exemplary epitaxial InAs//Al nanoscale device.
  a. Tilt-view SEM image an array of InAs//Al half-shell hybrid structures grown on an InAs (111)B substrate.
  b. TEM image of the top part of a nanowire taken from the sample shown in a with the Al shell covering to side facets to the right. The epitaxial Al layer is ~8 nm thick and covers two sidefacets of the nanowire as illustrated in the schematic cross section shown in the inset. The high resolution TEM image in panel
  c. shows that the Al forms a perfectly sharp and uniform interface to the InAs core.

For a given out of plane orientation of M, there exists a set of variants with certain in-plane orientations that minimizes the free energy. From the set of variants, the low energy grain boundaries can be obtained. Based on these statements, a simple general framework is provided to describe the structure of M, in terms of symmetries of M and SE. For NWs with rough surfaces, the orientation of the grains becomes more random, see FIG. 1 c. We are here only interested in the planar SE surfaces, and we neglect for simplicity what we assume to be small energy differences arising from polarity in the SE. The order of the plane rotational symmetries (PRS) of SE and M along a given crystal axis i will be denoted, $C_{i,SE}^{PRS,\perp}$ and $C_{i,M}^{PRS,\perp}$, respectively. The superscript $\perp$ specifies that we are considering the symmetries in the transverse direction, i.e. a single interface. Note that the PRS is not necessarily the same as the order of the corresponding symmetry operation $C_{i,SE}^{\perp}$ and $C_{i,M}^{\perp}$ of the bulk crystallographic point groups, as an atomic plane can have higher symmetry than the corresponding bulk operation. Thus, for a single SE/M interface i, the number of distinguishable degenerate crystal orientations in M are given as $$m_i^\perp = \frac{\square(C_{i,SE}^{PRS,\perp}, C_{i,M}^{PRS,\perp})}{C_{i,M}^1} \quad (0)$$

where $\square$ ($C_{i,SE}^{PRS}$, $C_{i,M}^{PRS}$) is the least common multiple of $C_{i,SE}^{PRS}$ and $C_{i,M}^{PRS}$. Equation (0) can be visualized using the bicrystal symmetry diagrams presented in FIG. 14.

We now consider symmetries along the NW axis, $\square$, and restricting the single facets to have only one class of variants. We will also assume that the cross sectional crystal shape of the NW follows the Wulff shape containing only the highest symmetry facets. Then we can say that if $C_{SE,i}^\square = C_{M,i}^\square$ there can be $m_i^\perp - 1$ different types of grain boundaries across the facets. If these grain boundaries are incoherent, they induce a high driving force for grain growth to eliminate the boundary across the facets, where the grain growth does not introduce new classes of variants due to the bicrystal symmetries. More general, if a given variant of the transverse dimension falls into symmetry operations of the parallel dimension, it will not contribute to new class of variants.

Epitaxial Domain Matching for Other Material Combinations

It may be difficult to predict material combinations which will form epitaxial interfaces SE/M NW heterostructures with a good epitaxial match. For example, surface diffusion lengths of metals on semiconductors are not generally available in the literature, and for a given metal, the large number of possible planes and surface orientations makes it difficult to predict domain matches. However, in the thick shell limit, where strain and grain boundary driven growth dominates, the lowest energy configuration is most likely when the SE and M crystals with similar symmetry groups (ZB or WZ and FCC) orientate along the same type of symmetry classes, especially if the bicrystal match is not to large. For nanowires grown in the conventional $[0001]_{WZ}$/ $[111]_{ZB}$ direction, a cubic metal phase with the [11-2] normal to the facets and [111] along the nanowire axis is unique in that its symmetry allow large single crystal segments with simultaneous epitaxial match on all facets of the nanowire. Thus, it is natural to expect, that if this orientation matches the semiconductor for a particular metal, it is likely to form in the thick film limit. Thus it is interesting to search among the cubic metals for matches in this orientation. FIGS. 18, 19 and 20 list the domain strains for a range of metals grown on the important cases of InAs, InSb, and GaAs. In the general notation $$\left(\frac{n_{M,\square}}{n_{SE,\square}},\varepsilon_\square\right)\times\left(\frac{n_{M,\perp}}{n_{SE,\perp}},\varepsilon_\perp\right),$$

we distinguish between interfacial match of interfacial units in the components and the corresponding strain along the length and along the transverse direction to the NW, as expected from relaxed bulk values.

If ZB and FCC orientation along the same type symmetry classes, the two numbers are identical in the parallel and perpendicular directions. FIGS. 18-20 suggest possible feasible material combinations—combinations without match in the tables may form epitaxial interfaces in other orientations.

Fabrication of Electrical Devices

The InAs/Al hybrid devices were liberated from their growth substrate by a brief sonication in methanol, and a small amount of the resulting suspension was deposited on doped Si substrates capped with 500 nm $SiO_2$. Wires were located with respect to predefined alignment marks using optical dark field microscopy and the ends of the wires were contacted using electron beam lithography (6% copolymer, 4% poly-[methyl methacrylate] (PMMA)) and electron beam evaporation of ~5/100 nm of Ni/Au or Ti/Au (AJA International, ATC ORION evaporator). The oxide on the Al surface was removed by 120 sec of Kaufmann argon ion milling performed inside the metal evaporation chamber (300 Volts acceleration, 46 mA emission current). This procedure reproducibly created contact to the Al shell.

For the devices with exposed InAs cores, narrow etch windows were defined in 4% PMMA resist by e-beam lithography, and the shell was removed by a ~2 sec etch in 12% hydrofluoric acid. Finally, the device is coated in 20-30 nm of hafnium oxide using atomic layer deposition. Note, that in order to employ the Al shell to aid electrical contacts, the second lithography step is in principle obsolete as the first metal layer can act as the etch mask for exposing the InAs core. Low temperature electrical measurements were performed in a dilution refrigerator (Leiden Cryogenics or Oxford Triton) using Stanford SR830 lock-ins with a 10 μV ac excitation.

Applications

Further aspects of the present disclosure relate to various application of the nanoscale device, e.g. a quantum point contact comprising a nanoscale device as herein disclosed having a semiconducting core and a superconducting facet layer. A further application is a superconducting field effect transistor comprising one or more of the presently disclosed nanoscale devices and/or electrical devices/contacts.

Second Facet Layer

As stated previously the present disclosure relates to a nanoscale device comprising an elongated crystalline nanostructure, such as a nanowire (crystal) or nanowhisker (crystal) or nanorod (crystal), having a plurality of substantially plane side facets and a first facet layer, i.e. a first facet layer, covering at least a part of one or more of said side facets. As demonstrated herein in example 3 in the case of a InAs nanowire with aluminum forming the first facet layer: for temperatures below the superconducting transition temperature aluminum becomes superconducting and the Al shell induces a superconducting gap into the InAs by virtue of the proximity effect. In contrast to all previous studies, however, the induced gap remains hard i.e., free of sub-gap states, likely due to the perfectly uniform InAs//Al interface. Aluminum is just one example of a superconductor and as listed herein there are other possible candidates for epitaxial matching of semiconductors and superconductors.

Other superconductors have different advantageous properties, such as higher critical temperatures and in particular higher critical magnetic fields, than those offered by aluminum. As a superconductor aluminum has a critical transition temperature Tc of approx. 1.3 Kelvin and a low critical magnetic field Bc. For many applications other superconductors with higher Tc and Bc are desired. For example, niobium has a Tc of ~9 Kelvin and vanadium Tc of ~5 Kelvin; using these elements as superconductors would therefore enable superconducting devices operating above liquid helium temperature (4 Kelvin) making them much more attractive for various superconducting applications. Also, niobium and vanadium has high Bc enabling the operation of superconducting devices in the presence of a sizable (order Tesla) field scale as needed for e.g., topological quantum information with Majorana Fermion bound states. Other superconductors and alloys have even higher Tc and Bc.

However, it can be difficult to find a semiconductor material where an epitaxial match with these other types of superconductors is obtainable. Another ingenious option may then be to use the first facet layer, e.g. in the form of epitaxially matched aluminum, as a coupling layer for interfacing a second—and different—facet layer to the nanoscale device, e.g. a second facet layer in the form of another type of material, alloy, or metal that become superconducting below $T_c$. In a further embodiment the presently disclosed nanoscale device may therefore comprise a second facet layer located on the outside or covering at least a part of the first facet layer, the second facet layer being different than the first facet layer. FIG. 15 illustrates the principle of depositing a second facet layer directly on to the first facet layer, in this case a layer of vanadium has been deposited onto a full shell hybrid with InAs/Al.

The first facet layer may have a crystalline structure which is epitaxially matched with the crystalline structure of the nanostructure. In this case the structure of the second facet layer is not necessarily important, i.e. second facet layer may have a crystalline structure which is or is not epitaxially matched with the crystalline structure of the nanostructure. The second facet layer may even have an amorphous structure.

The crystalline nanostructure may be provided in a semiconducting material, the first facet layer may be provided in a first material with superconducting properties below a first critical temperature, and the second facet layer may be provided in a second material with superconducting properties below a second critical temperature.

The thickness of the first facet layer is preferably less than 20 nm, more preferably less than 10 nm, even more preferred less than 8 nm, and more preferred less than 6 nm, and most preferred less than 5 nm.

The thickness of the second facet layer is preferably at least 50 nm, or greater than 100 nm, or greater than 150 nm, or greater than 200 nm, or greater than 300 nm. The thickness of the second facet layer is preferably at least two times the thickness of the first facet layer, or at least 3, 4, 5, 6, 7, 8, 9 or at least 10 times the thickness of the first facet layer.

The first facet layer may be a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W, whereas the second facet layer may be a metal, different from the first facet layer and, and selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.

The material of the second facet layer may be selected among a list of materials that becomes superconducting below a critical temperature and such lists are known in the art, e.g. it may be selected from the group of superconducting ceramic materials, in particular cuprates such as YBCO ($YBa_2Cu_3O_{7-x}$) or superconducting alloys. There are many types of superconducting alloys known in the art and which can be employed here, such as $MgB_2$, niobium alloys such as NiTi and NbTiN with various fractions of Ti and N, and $Zr_{100-x}M_x$ where x is any number in the range of 0 to 100 and M is a metal selected from the group of Fe, Co, Ni, Cu, Ru, Rh, Pd, Os, Ir, Pt and Au.

The crystalline nanostructure is preferably provided in a semiconducting material, such as selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.

The main advantage of first and second facet layer solution is that by proximity effect the combined first and second facet layers can effectively appear as a superconductor with the superconducting properties of the second facet layer but with the epitaxial matching properties of the first facet layer. E.g. in the case of an InAs nanowire with an epitaxially matched first facet layer of Al and with a non-epitaxially matched second facet layer of vanadium on top of the first facet layer, the hard gap induced from the Al due to the epitaxial matching between InAs and Al will also be induced from the vanadium layer by means of the vanadium-aluminum-InAs proximity effect thereby obtaining a superconducting device with a hard gap and a $T_c$ of approx. 5 Kelvin corresponding to the $T_c$ of vanadium. The first facet layer need only have a thickness of a few nanometers whereas the second facet layer can be much thicker. Furthermore, the first+second facet layer approach will work for both full-shell and half-shell hybrids. It is furthermore relatively straightforward to make a superconducting contact between the first and the second facet layers, e.g. if using metals. Furthermore, the second facet layer can be deposited by many different processes, e.g. evaporation, sputtering, pulsed laser deposition or chemical vapor deposition, all of which are less complicated and less time consuming than MBE. The solution with first and second facet layers thus provides a route to making hard induced gaps from arbitrary metals, materials or alloys. The epitaxial match between the crystalline structures of the semiconductor nanostructure and the first facet layer may be configured to induce a superconductor hard gap in the semiconductor nanostructure by virtue of the superconducting properties and proximity of the second facet layer, i.e. at a temperature below the critical temperature of the superconductor material of the second facet layer.

Prior to the deposition of the second facet layer the surface of the first facet layer may need chemical cleaning, e.g. in the form of chemical etching or mechanical cleaning, e.g. in the form of ion-milling, plasma cleaning, etc., in order to facilitate contacts to the second facet layer. In the example disclosed herein the surface of the Al was argon-milled to remove the Al-oxide which was present as the samples had seen ambient conditions (oxygen) between the two depositions. Cleaning is typically not needed if the sample is kept in vacuum between the depositions of two facet layers.

The second facet layer can for example be added on to the first facet layer by conventional evaporation or sputtering after cleaning the exposed surface of the first facet layer by chemical or mechanical methods if needed. The interface between the first and second facet layers will then consequently not be perfect. However, in case of e.g. high electron densities in the two layers a hard-gap contact is easy to form, for example with the case of a metal-metal interface. If the thickness of the first facet layer is much less than the thickness of the second facet layer and also much less than the coherence length in the first facet layer (which e.g. for aluminum is on the order of micrometers) then the resulting combination of the first and second facet layers will appear as a superconductor with Tc and Bc near those of the second facet layer, and at the same time with the epitaxial properties of the first facet layer thereby enabling an induced hard gap in the semiconductor.

Once a thin shell nanoscale device with an epitaxial first facet layer has been provided (as demonstrated herein), the surface of the first facet layer surface can be cleaned to remove e.g. oxides. Argon ion milling can for example be provided to remove the oxide on the first facet layer surface. However, the cleaning is not needed if the starting thin shell device has never been exposed to air. Subsequently thicker superconductor second facet layer of any choice can be deposited by for example standard electron-beam evaporation.

A double facet layer nanoscale device has been realized and characterized. FIG. 16a illustrates the schematic principle of an actual device with two facet layers (aluminium and vanadium) and a gold contact. FIG. 16b shows a picture of the actual device. The gap properties of the device in FIG. 16b has been measured and are illustrated in FIG. 17a-c. The gap is appearing above 4 Kelvin. At low temperatures the gap is a hard gap (factor ~100) with a gap magnitude of $\Delta^*=700$ meV which is almost four times larger than that of aluminum in the case of a single facet layer device.

For some compounds making a good contact between the first and second facet layers may be a problem. For example the ceramic high-Tc superconductors need oxygen when deposited as the second facet layer, which will inevitably oxidize the first facet layer in the case of e.g. aluminum. In such cases, adding a thin (approx. 0.3-10 nanometers) layer of an inert materiel, such as gold or another inert metal, such as Platinum, Iridium, Palladium, Osmium, Silver, Rothenium or Rhodium, in order to form a spacer between the first and second facet layers, is desirable in order to protect the surface of the first facet layer. A further embodiment of the presently disclosed nanoscale device therefore comprises a third facet layer (or intermediate layer or interface layer) located between the first facet layer and the second facet layer. The third facet layer is preferably an inert material, such as a Noble metal, such as Gold or Platinum or Iridium or Palladium or Osmium or Silver or Rothenium or Rhodium. Further, the thickness of the third facet layer is less than 10 nm, or less than 5 nm, or less than 4 nm, or less than 3 nm, or less than 2 nm, or less than 1 nm, or less than 0.5 nm. In case of e.g. Gold it can be added directly in the MBE or subsequently by evaporation. If the thickness of the third facet layer is thin enough the properties of the triple layers (first, third and second facet layers) will remain dominated by the thicker second facet layer.

Example 1—Semiconductor-Metal Epitaxy

The InAs nanowires are grown in two different axial crystal directions: the 'conventional' [0001]B, having six {1-100} sidefacets, and one of the six equivalent <1-100>$_{WZ}$ (or <11-2>$_{ZB}$) directions having a rectangular cross section with two (0001)B/(0001)A sidefacets and two {11-20} sidefacets. The Al phase is grown at a substrate temperature of −30° C. which is the lowest achievable in the MBE system used, i.e. without the use of a dedicated cooling source. For growth on the facets of the conventional nanowires we report on three different types of metal growths: one where the substrate was rotated, resulting in growth on all six sidefacets, and two types of growths with no substrate rotation, oriented for growth on either two or three facets. FIGS. 2 a, d and f show high-resolution TEM images of the most characteristic epitaxial match corresponding to three different types of the InAs/Al nanowires: the <0001> InAs nanowires with $h_{SU}$ □10 nm Al (FIG. 2a), <0001> nanowires with $h_{SU}$ □30 nm Al shells (FIG. 2d), and <01-10> nanowires with Al on the (111)B facet (FIG. 2f), respectively. Critical parameters linked to especially the low temperature electrical properties, depends on the thickness of the crystal phases and therefore on the overall morphologies of the Al shells. Examples are shown in the TEM images of FIG. 3 for three (two) different growths on <0001> (<01-10>) InAs nanowires with varying thickness of the Al. For thin half shell of Al ($h_{SU}$<□ 10 nm) on the <0001> nanowires and on the <01-10> nanowires in general, the surface of the Al is smooth.

For a thick Al shell ($h_{SU}$>□15 nm) on the facets on the <0001> nanowires, the surface of the Al becomes faceted (FIGS. 3b and c). In the half-shell geometry, the Al usually causes the hybrids to bend either towards or away from the Al-covered side providing indirect information about the interface mismatch. As an example, FIG. 3f shows an SEM image for the case of a nanowire with 10 nm Al grown on two facets. The nanowire bends towards the Al and thus suggests an interface with compressive (tensile) strain in the InAs (Al). To explain the strain induced in the crystals, we need to discuss the epitaxial relation and ordering of the SE/M interfaces in terms of domain matching. That is, when a lattice mismatch of a given SE/M material combination is large, interfacial domains—consisting of $n_m$ and $n_{SE}$ interfacial units of M and SE—form, in order to reduce the stress associated with the mismatch. We describe a given SE/M interface with the interfacial domain notation:

$$\left(\frac{n_{M,\square}}{n_{SE,\square}}, \varepsilon_\square\right) \times \left(\frac{n_{M,\perp}}{n_{SE,\perp}}, \varepsilon_\perp\right),$$

where $$\frac{n_M}{n_{SE}}$$

denotes the ratio of units in two orthogonal directions in the interfacial plane parallel □ and transverse ⊥ to the nanowire axis. $\varepsilon_i$ is the corresponding residual mismatch in the respective directions as expected from relaxed structures at room temperature. In FIG. 2 (b, c, e, g) is show simulations of three different types of interfaces with relaxed structures meeting in the interfacial plane, corresponding to the preferential bicrystal orientations that has observed in three different types of nanowires. Considering the epitaxial match at the InAs/Al interface for the thin Al shell on two facets (FIG. 2a), there are two obvious candidates in this orientation: either a small domain $$\left(\frac{3_{[11-2]}}{2_{[0001]}}, 6.5\%\right) \times \left(\frac{3_{[1-10]}}{2_{[11-20]}}, 0.3\%\right)$$

that gives a large mismatch along the nanowire axis, or a larger domain $$\left(\frac{7_{[11-2]}}{5_{[0001]}}, -0.5\%\right) \times \left(\frac{3_{[1-10]}}{2_{[11-20]}}, 0.3\%\right)$$

with a smaller mismatch. The two cases are simulated in FIGS. 2b and c, respectively. However, as shown in FIG. 3f, the hybrid structure bends towards the Al, suggesting that the negative and much smaller mismatch of the 7/5 interfacial domain along the nanowire length is formed.

Surprisingly it was found that for the thick shell hybrids (FIG. 2d and FIG. 3c) the preferential crystal structure is different with an out of interfacial plane orientation of (11-2). This gives a small and remarkably well matched $$\left(\frac{1_{[111]}}{1_{[0001]}}, 0.3\%\right) \times \left(\frac{3_{[1-10]}}{2_{[11-20]}}, 0.3\%\right)$$

domain, as simulated in FIG. 2e.

FIG. 2f shows the $(111)_{ZB}//(111)$ interface formed on the topfacet of the <11-2> InAs wires. Again, the Al forms with the (111) out-of-plane orientation and keeps this orientation also for thicker Al shells (FIG. 2d, e). This match provides not only a planar and uniform film due to a (111) out of plane orientation, but also a highly ordered epitaxial domain match, $$\left(\frac{3_{[11-2]}}{2_{[11-2]_{ZB}}}, 0.3\%\right) \times \left(\frac{3_{[1-10]}}{2_{[1-10]_{ZB}}}, 0.3\%\right),$$

with only a slightly positive strain along the nanowire length, consistent with an observed bending away from the Al.

For a given out of plane orientation there exist a number of distinguishable grains with indistinguishable interfacial domains. This is a consequence of the order of the plane rotational symmetries (PRS) of SE and M, $C_{i,SE}^{PRS,\perp}$ and $C_{i,M}^{PRS,\perp}$, which are not necessarily the same as the order of the corresponding bulk rotational symmetries, $C_{i,SE}^{\perp}$ and $C_{i,M}^{\perp}$. In general, for a given type of SE □M interface i, the number of distinguishable degenerate crystal orientations (variants) in M, is given as $$m_i^{\perp} = \frac{\square(C_{i,SE}^{PRS,\perp}, C_{i,M}^{PRS,\perp})}{C_{i,M}^{\perp}} \quad (2)$$

where $\square(C_{i,SE}^{PRS}, C_{i,SU}^{PRS})$ is the least common multiple of $C_{i,SE}^{PRS}$ and $C_{i,SU}^{PRS}$.

All three types of interfaces in FIG. 2 have a two-fold degeneracy, meaning that two in-plane orientations will nucleate with equal probability. These two variants have been seen for the (1-100)//(111) match in nanowires with a thin shell of Al on two facets, and in FIG. 4a, the two orientations are seen for (1-100)//(11-2) orientation with a thick full shell, consistent with equation (2). However, in the thick full shell devices only rarely are grain boundaries seen in the crystal structure around the nanowires.

To explain the formation of the different crystal structure orientations as function of phase thickness and type of device (full shell, half shell, etc.), the essential mechanisms can be understood using two independent parameters: $\{X\} \in \{h_{M'}, R_{M'}\}$, where $h_{M'}$ is the average grain thickness and $R_{M'}$ is the average in-plane radius of curvature. While $h_{M'}$ plays an important role in the formation of the overall morphology, we are here interested in the mechanisms leading to grain growth, which are driven mainly by $R_{M'}$. It is convenient to separate the excess free energy into two contributions: the excess free energy which arises from the bonding at the interfaces, and what arise from coherent strain or misfit dislocations due to lattice or domain mismatch. The corresponding driving force for the grain growth in the thin film regime relative to an average grain of the metal phase, $\overline{M}$ is given by $$\delta\mu_{M'}^{R_{M'}} = \Omega_s \frac{\gamma_{surface,M'} + \gamma_{SE||M'}}{h_{M'}} + \Omega_s \frac{\gamma_{\overline{M}||M'}}{R_{M'}} + \frac{\Omega_s S\varepsilon^2}{(1-v)} - \mu_{\overline{M}}^{R_{M'}} \quad (1)$$

where $\Omega_s$ is the atomic volume, $\gamma_{surface,M'}$, $\gamma_{SE||M'}$ and $\gamma_{\overline{M}|M'}$ are the free energy densities of the surface (per nanowire length), the SE||M' interface, and the grain boundaries, respectively. S is the shear modulus, v is Poisson's ratio and strain parameter defined as, $\varepsilon^2 \equiv \varepsilon_{\square}^2 + \varepsilon_{\perp}^2 + 2v\varepsilon_{\square}\varepsilon_{\perp}$. When $\delta\mu_{M'}=0$, the grain size of M' stays constant on average, while $\delta\mu_{M'}>0$ and $\delta\mu_{M'}<0$ imply an average driving force for elimination and expansion, respectively. For the epitaxial growth of planar bicrystals, the host crystal is presumed to be a fixed inflexible reference crystal for which the growing crystal has to adapt to.

If the host crystal is a nanowire, it can also be considered as a fixed reference in terms of crystal structure, orientations, and overall faceting, however, unlike the case of two-dimensional planar growth, its finite size allows compression, stretching or bending, which play an important role in the strain relaxation of the whole complex, and therefore on the s parameter. SE □M interfaces with a high interfacial order (small domains with small residual mismatch) are generally also interfaces with a relative low interfacial free energy, not only because of the contributions from coherency strain and/or misfit dislocations, but also because it is easier to form an electronic match with a low chemical energy. However, it is not necessarily also the corresponding grain orientations with the highest probability of formation, since, according to equation (1), many factors play a role during growth.

In the initial stage of the metal growth, islands forms at the semiconductor surface, where the substrate temperature plays an important role on the spacing between the islands. If the temperature is low enough, the spacing is so small that the islands will merge at very thin film thicknesses, which according to equation (1) will lead to surface driven grain growth.

As the metallic phase grows thicker, the surface-to-volume ratio decreases, and the last two terms of equation (1) become increasingly important. The stress induced from the InAs/Al interface and from incoherent grain boundaries meeting on a sidefacet or across adjacent sidefacets provide a driving force for reconstruction into a less strained and lower total energy configuration. In FIGS. 3a, b and c, a transition is observed for half shell devices around $h_{SU}\square 20$ nm to a more faceted Al surface having primarily (112) out of plane orientations at the interface (FIG. 3d).

For thick full shell devices (FIG. 4), the out-of-plane orientation is (11-2) as in the case shown in FIG. 2d, which gives two variants according to Eq. (1). In the following the two variants are labelled α and β. Along the nanowire axis, the InAs and Al have a six-fold and three-fold rotational symmetry, respectively. Thus, two Al grains put together by a six-fold rotation lead to incoherency. However, if the variants alternate around the nanowire, it will form a single crystal with <1-100>||<11-2> type domains on all six sidefacets (FIG. 4d). Only because the 6-fold rotational symmetry of WZ nanowire axis is really a screw axis the perfect bicrystal symmetry is broken (FIG. 4f), which may induce a small additional strain field around the edge where the sidefacets meets. Since, the Al growth preferentially start forming (111) out of plane orientated grains, which eventually reconstructs into other orientations, and eventually into (1-100)||(112) α and β variants, it is striking that single crystals can be observed all along the hybrids, as shown in FIG. 4a for the thick full shell nanowire. This can be understood from equation (2), since incoherent grain boundaries within the Al induce high interfacial energies (large γ $\overline{M|M'}$) as compared to coherent boundaries, which gives a strong driving force for grain reconstruction to eliminate incoherencies. Thus if grains of the same variant nucleate on adjacent facets, the resulting incoherent interface may drive an elimination/reconstruction of the smaller on expense of the larger. However, kinetically locked incoherent interfaces are possible as shown in FIG. 4e, and are appearing frequently. For the grain boundaries meeting along the direction of the nanowire, α and β variants form low energy coherent twin boundaries, which do not lead to a driving force which is strong enough to eliminate the grain boundaries.

Having established the feasibility of MBE to grow high quality InAs/Al interfaces, it opens for the possibility of controlled formation of contact barriers. This can be important for many types of possible applications, as barriers of high band-gap materials are routinely inserted into heterostructures in semiconductor technology. An important example can be in the formation of semiconductor-superconductor hybrid devices, where it has been predicted to enhance the magnitude of the induced proximity gap, and also to minimize the amount of quasi-particle poisoning. We demonstrate this method for the InAs/Al hybrids by intentionally growing a 3 nm segment of high band-gap AlAs (band gap of 2.12 eV) at the interface, using what we interpret as a backward growth mode. In FIG. 4g, the AlAs is clearly seen as a change in contrast in the TEM image and are verified by Electron Dispersive X-ray analysis and analysis of lattice spacings.

To study the electrical coupling between the shell and the InAs, devices were fabricated where the core was exposed by selectively etching a segment of the Al between the contacts. The nanoscale device is illustrated in the insets to FIG. 5d. The exposed semiconductor becomes susceptible to electrostatic gating, and the device appears as a nanowire field effect transistor with the Al shell acting contacts. FIG. 5d shows measured conductance as a function of the voltage $V_g$ applied to the conducting back plane for various temperatures above $T_c$. As is generally observed, the undoped InAs nanowire acts as an n-type semiconductor and is depleted at $V_g=-10V$ and the conductance increases with $V_g$ to 2.8 $e^2/h$ at $V_g=10V$. Other devices with shorter exposed InAs segments had conductivities up to 6 $e^2/h$ at $V_g=10V$. These values are comparable to the best results we have achieved for devices of comparable lengths and diameters using conventional contacting schemes with either HF etching, $(NH_4)_2S_x$ passivation, or argon milling for removing the native InAs oxide prior to metal evaporation. This indicates that the epitaxial shell forms a barrier-free metal/semiconductor contact as is further supported by the temperature dependence of the transfer curves: For $V_g>2V$ the conductance increases upon cooling due to the reduction of phonon scattering rather, than decreases as is most often observed for imperfect contacts due to the reduction of thermally excited transport over contact barriers.

Example 2—Superconducting Properties

As seen in example 1 InAs and Al can form a highly ordered epitaxial domain match. In continuation hereof InAs/Al is an interesting material system for topological SE/SU quantum devices because of the large spin orbit coupling in InAs and large superconducting coherence length in Al.

Four-terminal devices were therefore fabricated on an InAs nanowire with a 13 nm Al full shell. FIGS. 5a and b show the device schematic and SEM micrograph of the device, respectively. The inset in FIG. 5c shows the temperature dependence of the four-terminal resistance. The Al shell remains intact along the wire and the resistance is 50Ω for temperatures above ~1.6K below which there is gradual transition to a 0Ω superconducting state which is fully developed at ~1.3K. The main panel of FIG. 5c shows the resistance of the Al shell as a function of a magnetic field applied parallel to the nanowire. For low fields, the resistance vanishes as expected for a superconductor, and the zero-resistance state persists up to 1.3 Tesla, only interrupted by finite resistance peaks at half-multiples of flux-quanta threading the wire. The latter phenomenon is related to the full-shell topology and is the well-known Little-Parks effect of superconductors in a double connected geometry. The oscillations only occur as long as the shell is in the superconducting state, and thus the shell has a critical magnetic field $B_c$~1.9T consistent with the results for a 13 nm thick planar Al film.

However, the technique developed above for InAs/Al hybrids is not restricted to this particular choice of materials and the theoretical formalism is generally applicable. As a first approximation combinations where metal grains with <112> out of plane orientations match InAs, and InSb semiconductor nanowires grown in the conventional <0001>$_{WZ}$ or <111>$_{ZB}$ directions can be suggested. As described above, the symmetries of this orientation are particularly appealing and allow single coherent grains to match the semiconductor across multiple facets. It can therefore be expected that these orientations to be likely to occur in the thick film limit if they are matched in a given SE/M system. In addition to the InAs/Al system (2/3 domain ratio, 0.3% strain), other noteworthy well-matched combinations include InAs/Au (2/3 domain ratio, 1.0% strain) which may serve as model contact materials for non-superconductive applications, and InAs/V (1/2 domain ratio, 0.3% strain) and InSb/Nb (1/2 domain ratio 1.8% strain) which are important combinations for high-critical temperature and magnetic field superconducting contacts to strong spin-orbit semiconductors.

For temperatures below the superconducting transition temperature the Al shells induces a superconducting gap into the InAs by virtue of the proximity effect. In contrast to all previous studies, however, the induced gap remains hard i.e., free of sub-gap states, likely due to the perfectly uniform InAs//Al interface. The presently disclosed nanoscale devices thereby remove a main obstacle for using semiconductor nanowires as the backbone in future schemes of topological quantum information based on Majorana Fermions. In this context it is noted that the InAs//Al epitaxial hybrids fulfill all basic requirement remaining for use in Majorana devices: strong spin-orbit coupling, large critical parallel magnetic field, and gate-tunability.

Example 3—Hard Gap in Epitaxial Superconductor-Semiconductor Nanowires

Key signatures of topological superconductivity and associated Majorana end states, including a characteristic zero-bias tunneling peak appearing at finite magnetic field, have been reported in the prior art over the past few years. In all cases, a soft gap is also seen, indicated by sizable subgap conductance. The origin of the soft gap is not fully understood, with recent theory attributing it to disorder at the semiconductor/superconductor interface, combined with inverse proximity effect at the normal-metal tunnel barrier. Besides complicating an already complex mesoscopic system by allowing alternative (Kondo) processes that can themselves give rise to zero-bias tunneling peaks, subgap states are fatal to topological protection. This is because quasiparticles occupying subgap states will inadvertently participate in braiding, thus influencing resulting quantum states in an unpredictable and possibly time-dependent way.

InAs nanowires were grown in the wurzite [0001] direction by molecular beam epitaxy (MBE) as also described above. After the nanowires reached a length of 5-10 µm, Al was grown at low temperature by angled deposition within the MBE chamber. The resulting semiconductor-superconductor interface, shown in FIG. 6c, appears coherent, domain matched, and impurity free. Rotating the substrate during Al growth results in full-shell nanowires (FIG. 6a); directional growth without rotating yields halfshell nanowires, with Al on two or three facets of the hexagonal InAs core. The nanowires were then dispersed onto a doped Si substrate with a 100 nm oxide. The Al shell was contacted by superconducting Ti/Al (5/130 nm) and the InAs core (exposed with a selective Al etch) with normal Ti/Au (5/80 nm). Modest in situ ion milling was used to improve contact between both the core and shell to leads. A device similar to the one measured is shown in FIG. 6d. Control devices were fabricated by etching away the Al shell and evaporating Ti/Al in select areas (FIGS. 6b and 6d). The 5 nm Ti sticking layer seemed to improve gap hardness in all control devices. A number of epitaxial devices and control devices were measured and showed similar behavior.

The carrier density in the exposed InAs was tuned via the backgate voltage, VBG. The additional side gate was not used (see FIG. 6b) in these measurements. External magnetic field, B, was applied along the nanowire, unless stated otherwise. All measurements were performed in a dilution refrigerator with a base temperature of 20 mK. Devices into a tunneling regime (G<<G$_0$=2 e$^2$/h) by reducing VBG. The tunneling spectra of a full-shell epitaxial device (blue) and an evaporated control device (red) in the weak tunneling regime, with conductance of the exposed core tuned to G<<G$_0$=2 e$^2$/h are shown in FIG. 6e. In the superconducting state (B=0), differential conductance GS as a function of source-drain voltage, VSD, shows symmetric peaks with suppressed conductance between. Above a critical value of field, B$_c$ (~75 mT for epitaxial, ~250 mT for control), both devices show a featureless normal-state tunneling conductances, G$_N$, of approx. 0.01 e$^2$/h. The ratio G$_S$/G$_N$ for both the epitaxial and control devices is shown in FIG. 6f. The positions of the peaks in GS indicate a gap of Δ*=190 µeV, similar to the gap of bulk Al, and suppression by a factor of approx. 100 of subgap conductance. The evaporated control device shows a slightly smaller induced gap of 140 µeV, and a suppression of subgap conduction by a factor of approx. 5, comparable to previous measurements in InAs and InSb nanowires [10-15].

Increasing V$_{BG}$ increases both subgap and above-gap conductances of the epitaxial full-shell device. A pair of subgap resonances (SGR) appears close to the gap edge in the range −11 V<V$_{BG}$<−8 V (FIG. 7a). The appearance of this SGR coincides with a sharp increase in the above-gap conductance. The rest of the tunneling spectrum is devoid of other SGRs. In this device, no evidence of dot-like charging physics was observed (FIG. 7b). Conductance peaks independent of V$_{BG}$ occur at V$_{SD}$=190 µV, and in some areas the subgap conductance exceeds the normal state conductance. This subgap conductance enhancement is illustrated in FIG. 7c, which shows two vertical cuts taken at low and high backgate voltages (indicated by orange and green lines in FIGS. 7a and 7b). In FIG. 7d we plot the superconducting zero-bias conductance as a function of conductance at VSD=0.4 mV. On the same graph is shown, with no free parameter, the theoretical dependence between G$_S$(V$_{SD}$=0) and G$_N$(V$_{SD}$=0), given by the following expression in Blonder-Tinkham-Klapwijk-Beenakker (BTKB) theory:

$$G_S \mid_{V_{SD}=0} = 2G_0 \frac{G_N^2}{(2G_0 - G_N)^2} \quad (1)$$

The nanoscale device also exhibits conductance steps as a function of V$_{BG}$ (FIG. 7e), a typical signature of quantum point contacts (QPC). Zero-bias conductance in the normal state (black line) shows plateaus at values close to 1, 3, 6, and 10 e$^2$/h. In the superconducting state and at source-drain bias above Δ*/e (red line), the device conductance shows a similar behavior, but begins to deviate above 6 e$^2$/h. Plateaus are less defined at zero-bias in the superconducting state (green line). Instead, conductance oscillates around the normal state values and peaks on the lower V$_{BG}$ edge of the normal state plateaus. Not all of the measured devices, epitaxial or evaporated, form QPCs. Instead, a quantum dot (QD) can form in the exposed InAs core (FIG. 8a). In the normal state of an epitaxial full-shell QD device, Coulomb diamond resonances and well defined even-odd structures can be identified (see supplementary information). In the superconducting state, symmetric SGRs in the shape of inverted bells occupy the odd diamond valleys (FIG. 8b). These SGRs, arising from Andreev bound states (ABS) or Yu-Shiba-Rusinov states, have been extensively investigated in the prior art.

Similar QD structure and their associated SGRs in the superconducting state are also observed in the control devices. Vertical cuts at the particle-hole symmetry point of an odd (orange) and even (green) Coulomb valley are shown in FIG. 8c. Away from the SGRs, both even and odd Coulomb valley traces show highly suppressed subgap conductances. We compare the normalized conductance of an epitaxial full-shell QPC device against an epitaxial full-shell QD device tuned to the middle of an even Coulomb valley (FIG. 8d). The two measurements are almost indistinguishable, and this experimental observation allows us to compare induced gap measurements between various devices, regardless of their QPC or QD nature. Since fabricated QPC devices are of a rarer variety than QD devices in nanowire systems, all comparisons between epitaxial and evaporated devices are between the epitaxial full-shell QPC device and an evaporated QD device.

In FIGS. 9a and 9b we study the evolution of the induced gap as a function of magnetic field and temperature. We then compare the normalized zero-bias conductance of an epitaxial full-shell device against an evaporated control device in FIGS. 9c and 9d. Since the subgap conductance in epitaxial devices is close to our experimental noise-floor, we average over a 40 µV window centered about zero-bias and define this value as $G_S^{(0)}/G_N^{(0)}$. Experimental error bars smaller than the marker size in FIGS. 9c and 9d are not shown. For better comparison the applied magnetic field is normalized by the critical fields of each device in FIG. 9c. FIG. 9d shows the normalized zero-bias conductance as a function of temperature. We fit the temperature dependent tunneling conductance of a N—S junction in BCS theory to data from the epitaxial full-shell device. The theoretical dependence is given by the expression:

$$\left.\frac{G_S}{G_N}\right|_{V_{SD}=0} = \sqrt{\frac{2\pi\Delta^*}{k_B T}}e^{-\Delta^*/k_B T} \quad (2)$$

where $k_B$ is the Boltzmann constant and T is the temperature. From the theoretical fit (blue line), we extract an induced gap of 160 µeV.

Similar devices were fabricated on epitaxial half-shell nanowires (FIGS. 10a, 10b, and 10d), with the exception that an additional Al lead is added to the device, and these leads now contact both the shell and the core. Identical tunneling spectroscopy is performed on these devices, and we compare the induced gap quality of the full-shell QPC device to a half-shell QD device in FIG. 10c. The induced gap size of an epitaxial half-shell device (180 µeV) is similar to the induced gap size in epitaxial full-shell devices. The normalized subgap conductance is a factor of 50 lower than the normal state conductance, substantially better than the induced gap in evaporated control devices.

The additional Al lead to the shell allows us to explore the gate-tunability of the half-exposed InAs core. As illustrated in FIG. 10b a current bias is applied between the two Al leads and the voltage drop is measured when the device is in the normal state ($B_\perp$=100 mT>$B_c$). Conductance through the normal state Al shell and the semiconducting InAs core is shown in FIG. 10e. It remains roughly constant at 10 $e^2$/h below $V_{BG}$=3 V, then rises to approximately 45 $e^2$/h at much higher $V_{BG}$. Normalized subgap conductance suppression of up to two orders of magnitude represents a significant improvement in the hardness of induced gaps in InAs nanowires. This number should be regarded as a lower bound limited by the experimental noise floor of measurement set-up used (FIG. 6f). While the effects of a Ti sticking layer on the hardness of the proximitized gap cannot be isolated, it is noted that the control devices fabricated without the sticking layer have produced far inferior induced gaps. The collective measurements across multiple devices, epitaxial and evaporated, suggest that the soft gap is a result of semiconductor-superconductor interface roughness.

Commonly practiced methods of proximitizing these nanowires require the removal of native oxides either via chemical etching or physical ion-milling before the deposition of a superconducting metal. These fabrication steps can potentially damage the crystalline semiconductor surface. Interface quality aside, the QPC nature of the presently disclosed epitaxial full-shell device demonstrates ballistic transport in the semiconducting core. The only SGR present in the QPC device (FIG. 2a) coincides in $V_{BG}$ with the first conductance plateau in the normal state. We interpret this resonance as an ABS formed from the first sub-band of a one-dimensional channel [36].

In the tunneling limit the normal state conductance is approximated by the quasiparticle transport conductance measured at sufficiently high source-drain bias ($V_{SD}$=0.4 mV>$\Delta^*$/e). Comparing this value against the zero-bias superconducting state conductance excellent agreement is found between experiment and BTKB theory (FIG. 7d). What is remarkable is that the comparison between experiment and theory has no free parameter. The zero-bias superconducting state conductance of a single channel N—S junction depends solely on the transmission coefficient, $\tau$, which, in Landauer formalism, is directly proportional to the normal state conductance. Measurement noise notwithstanding, the striking similarity between experiment and theory tells us that the hardness of the induced gap is close to its theoretical limit.

Further agreement with BTKB theory can be found by comparing subgap conductances between the tunneling regime and the open transport regime (FIG. 7c). At low backgate voltages, the probability of Andreev reflection is low because of a high tunnel barrier (FIG. 8a, upper panel) between the normal lead and the proximitized InAs core. At high backgate voltages, the barrier is lowered and the subgap conductance is enhanced above its normal state value. However, it is noted that there remains a finite probability for an electron to specular reflect against the proximitized core. This is evident from the fact that the subgap conductance never reaches twice its normal state value.

Conductance steps as a function of backgate voltage are evident in FIG. 7e, but the steps do not occur at typical QPC values. The discrepancy could be attributed to imperfect transmission of one-dimensional conduction modes and additional symmetries in the transverse confining potential of the nanowire. In addition, while line resistances have been subtracted from our measurement set-up, additional contact resistances within the device cannot be accounted for.

While QPCs and QDs represent vastly different transport regimes in a nanowire, both types of devices allow tunneling spectroscopy to be performed on the proximitized core. As illustrated in FIG. 8a, a QPC near pinch-off forms a single tunnel barrier between the normal electrode and the InAs core. On the other hand, a single QD can be envisioned as two tunnel barriers with discrete states in between. Since the charging energy of the reported QD device is larger than the induced gap Δ*, when VBG is tuned to the particle-hole symmetry point of an even Coulomb diamond, the discrete QD states are far from the edge of the induced gap. The QD thus acts as a single tunnel barrier between the normal lead and the proximitized InAs core. The agreement of tunneling spectroscopy measurements between the QPC and the QD device (FIG. 8c) serves as an experimental validation of this interpretation. In FIGS. 9a and 9c, it is noted that the floor of the induced gap remains close to zero, rising sharply only when B approaches $B_c$. Retaining a hard gap at finite magnetic fields is an important trait for Majorana bound state experiments since theoretical framework requires that the Zeeman energy in the semiconductor be larger than the induced s-wave pairing gap. While the temperature dependent tunneling conductance from BCS theory qualitatively fits the experimental observation (FIG. 10d), the extracted induced gap of 160 μeV does not coincide with the tunneling spectroscopy measurement of Δ*=190 μeV. Alternatively, one can interpret this discrepancy as an effective device temperature that is roughly a factor of 1.2 larger than the measured temperature of the dilution refrigerator. Although the actual electron temperature can be higher than the cryostat temperature, the two values are expected to agree fairly well at elevated temperatures above 100 mK.

Turning the attention to the epitaxial half-shell variety of nanowires, it is found that the induced gap has similar hardness to their full-shell cousins (FIG. 10c). More interestingly, in the normal state of the Al shell, the conductance between the two Al leads is gate-dependent. The resistance saturates at about 2.5 kΩ below $V_{BG}$=3 V, and lowers to about 600Ω at higher backgate voltages (FIG. 10e). The saturated resistance is interpreted to be the resistance of the Al shell, and the subsequent reduction of resistance to come from the opening of a parallel conduction channel through the InAs core. The following transport parameters are estimated for the InAs core: (i) carrier density (at high $V_{BG}$), n=5×10$^{18}$ cm$^{-3}$ (ii) mobility, μ=3300 cm$^2$/V$_s$ (iii) elastic scattering length, $I_e$=100 nm. These are typical values for InAs nanowires. However, the expected resistance for the present Al shell should be on the order of 10Ω. The higher measured resistance could be attributed to additional contact resistance between the Al leads and the Al shell.

While epitaxial full-shell nanowires provide interesting geometries (cylindrical superconducting shell) for future experiments, it is probably the epitaxial half-shell variety that strongly interests the Majorana community. The possibility of controlling the sub-band occupation in a large spin-orbit, large g-factor quasi-one-dimensional semiconductor while maintaining a hard induced superconducting gap makes the epitaxial half-shell nanowire an ideal platform for nanowire-based Majorana qubits.

Further details

1. A nanoscale device comprising an elongated crystalline nanostructure, such as a nanowire (crystal) or nanowhisker (crystal) or nanorod (crystal), having a plurality of substantially plane side facets and a first facet layer covering at least a part of one or more of said side facets.
2. The nanoscale device according to item 1, wherein the first facet layer is crystalline.
3. The nanoscale device according to any of preceding items, wherein the two-dimensional interface between a side facet of the crystalline nanostructure and the first facet layer is epitaxial.
4. A nanoscale device comprising an elongated crystalline semiconductor nanostructure, such as a nanowire (crystal) or nanowhisker (crystal) or nanorod (crystal), having a plurality of substantially plane side facets and a crystalline structured first facet layer of a superconductor material covering at least a part of one or more of said side facets, and wherein the crystalline structure of the semiconductor nanostructure is epitaxially matched with the crystalline structure of the first facet layer on the interface between the two crystalline structures.
5. The nanoscale device according to any of preceding items, wherein the two-dimensional interfaces between each side facet of the crystalline nanostructure and the first facet layer are epitaxial, such as simultaneously epitaxially matched.
6. The nanoscale device according to any of preceding items, wherein each two-dimensional interface between a side facet of the crystalline nanostructure and the first facet layer are domain matched and/or lattice matched in at least one dimension.
7. The nanoscale device according to any of preceding items, wherein each two-dimensional interface between a side facet of the crystalline nanostructure and the first facet layer are domain matched and/or lattice matched in both dimensions.
8. The nanoscale device according to any of preceding items, wherein the crystalline structure of the nanostructure is epitaxially matched with the crystalline structure of the first facet layer.
9. The nanoscale device according to any of preceding items, wherein the nanostructure is an elongated hybrid nanostructure comprising a crystalline semiconductor nanostructure and wherein the first facet layer is a crystalline structured layer of a of superconductor material and wherein the crystalline structure of the semiconductor nanostructure is epitaxially matched with the crystalline structure of the first facet layer on the interface between the two crystalline structures.
10. The nanoscale device according to any of preceding items 9, wherein the epitaxial match and the proximity between the crystalline structures of the semiconductor nanostructure and the first facet layer is configured to induce a superconductor hard gap in the semiconductor nanostructure.
11. The nanoscale device according to any of preceding items 9-10, wherein the epitaxial match between the crystalline structures of the semiconductor nanostructure and the superconductor first facet layer and the proximity and superconductor properties of the second facet layer are configured to induce a superconductor hard gap in the semiconductor nanostructure
12. The nanoscale device according to any of preceding items, wherein each two-dimensional interface between a plane surface of the nanostructure and the first facet layer is domain matched and/or lattice matched in at least one dimension.
13. The nanoscale device according to any of preceding items, wherein the crystal structure of the elongated crystalline nanostructure and the crystal structure of the first facet layer belong to different lattice systems.
14. The nanoscale device according to any of preceding items, wherein the Bravais lattice of the elongated crystalline nanostructure is different from the Bravais lattice of the first facet layer.

15. The nanoscale device according to any of preceding items, wherein the crystal structure of the elongated crystalline nanostructure is selected from the group of zincblende and wurtzite.

16. The nanoscale device according to any of preceding items, wherein the crystal structure of the first facet layer is selected from the cubic crystal system, such as primitive cubic, BCC or FCC, or orthorhombic, trigonal, tetragonal or perovskite.

17. The nanoscale device according to any of preceding items, wherein the first facet layer comprises one or more large single crystal segments wherein the interface between the elongated crystalline nanostructure and said single crystal segment(s) is epitaxially matched, such as simultaneously epitaxially matched on all side facets.

18. The nanoscale device according to any of preceding items, wherein the elongated crystalline nanostructure is substantially one-dimensional.

19. The nanoscale device according to any of preceding items, wherein the elongated crystalline nanostructure is formed from branched nanowhisker crystals.

20. The nanoscale device according to any of preceding items, wherein the elongated crystalline nanostructure comprises one or more kinks.

21. The nanoscale device according to any of preceding items, wherein the crystalline nanostructure is a single crystal.

22. The nanoscale device according to any of preceding items, wherein the crystalline nanostructure comprises one or more large single crystal segments.

23. The nanoscale device according to any of preceding items, wherein the crystalline facet layer comprises one or more large single crystal segments, such as single crystal segments having an extension of at least 20 nm, or least 30 nm, or at least 40 nm, or at least 50 nm.

24. The nanoscale device according to any of preceding items, wherein the crystalline nanostructure is composed of one or more crystals.

25. The nanoscale device according to any of preceding items, wherein the crystalline nanostructure is a heterostructured nanowire crystal.

26. The nanoscale device according to any of preceding items, wherein the crystalline nanostructure is a heterostructured nanowire crystal composed of varying compounds in the axial and/or radial direction.

27. The nanoscale device according to any of preceding items, wherein the crystalline nanostructure is provided in a semiconducting material.

28. The nanoscale device according to any of preceding items, wherein the crystalline nanostructure is provided in a semiconducting material selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.

29. The nanoscale device according to any of preceding items, wherein the first facet layer is a metal.

30. The nanoscale device according to any of preceding items, wherein the first facet layer is provided in a material with superconducting properties below a critical temperature $T_c$.

31. The nanoscale device according to any of preceding items, wherein the first facet layer is a metal selected from the group of Al, Ne, Ar, Ca, Ni, Cu, Kr, Sr, Rh, Pd, Ag, Xe, Ce, Yb, Ir, Pt, Au, Pb, Ac, Th, Li, Na, K, V, Cr, Fe, Rb, Nb, Mo, Cs, Ba, Eu, Ta and W.

32. The nanoscale device according to any of preceding items, wherein the cross-section of the crystalline nanostructure is square providing a total of four side facets.

33. The nanoscale device according to any of preceding items, wherein the cross-section of the crystalline nanostructure is hexagonal providing a total of six side facets.

34. The nanoscale device according to any of preceding items, wherein the first facet layer is covering at least a part of 1, 2, 3, 4, 5, 6 or more of the side facets.

35. The nanoscale device according to any of preceding items, wherein the thickness of the first facet layer is less than 300 nm, or less than 250 nm, or less than 200 nm, or less than 150 nm, or less than 100 nm, or less than 90 nm, or less than 80 nm, or less than 70 nm, or less than 60 nm, or less than 50 nm, or less than 45 nm, or less than 40 nm, or less than 35 nm, or less than 30 nm, or less than 25 nm, or less than 20 nm, or less than 19 nm, or less than 18 nm, or less than 17 nm, or less than 16 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm.

36. The nanoscale device according to any of preceding items, wherein the diameter of the crystalline nanostructure is between 10 and 200 nm, such as between 10 and 20 nm, or between 20 and 30 nm, or between 30 and 40 nm, or between 40 and 50 nm, or between 50 and 60 nm, or between 60 and 70 nm, or between 70 and 80 nm, or between 80 and 90 nm, or between 90 and 100 nm, or between 100 and 110 nm, or between 110 and 120 nm, or between 120 and 140 nm, or between 140 and 160 nm, or between 160 and 180 nm, or between 180 and 200 nm.

37. The nanoscale device according to any of preceding items, wherein the length of the crystalline nanostructure is between 1 and 20 µm, or between 1 and 2 µm, or between 2 and 3 µm, or between 3 and 4 µm, or between 4 and 5 µm, or between 5 and 6 µm, or between 6 and 7 µm, or between 7 and 8 µm, or between 8 and 9 µm, or between 9 and 10 µm, or between 10 and 12 µm, or between 12 and 14 µm, or between 14 and 16 µm, or between 16 and 18 µm, or between 18 and 20 µm.

38. The nanoscale device according to any of preceding items, further comprising a second facet layer covering at least a part of the first facet layer.

39. The nanoscale device according to any of preceding items 38, the first facet layer having a crystalline structure which is epitaxially matched with the crystalline structure of the nanostructure.

40. The nanoscale device according to any of preceding items 39, the second facet layer having a crystalline structure which is not epitaxially matched with the crystalline structure of the nanostructure.

41. The nanoscale device according to any of preceding items 38 to 40, wherein the crystalline nanostructure is provided in semiconducting material, the first facet layer is provided in a first material with superconducting properties below a first critical temperature, and the second facet layer is provided in a second material with superconducting properties below a second critical temperature.

42. The nanoscale device according to any of preceding items 41, wherein the first critical temperature is lower than the second critical temperature.
43. The nanoscale device according to any of preceding items 38 to 42, wherein the thickness of the first facet layer is less than 20 nm, or less than 10 nm, more preferred less than 8 nm, more preferred less than 6 nm, more preferred less than 5 nm.
44. The nanoscale device according to any of preceding items 38 to 43, wherein the thickness of the second facet layer is at least 50 nm, or greater than 100 nm, or greater than 150 nm, or greater than 200 nm, or greater than 300 nm.
45. The nanoscale device according to any of preceding items 38 to 43, wherein the thickness of the second facet layer is at least two times the thickness of the first facet layer, or at least 3, 4, 5, 6, 7, 8, 9 or at least 10 times the thickness of the first facet layer.
46. The nanoscale device according to any of preceding items 38 to 44, further comprising a third facet layer located between the first facet layer and the second facet layer.
47. The nanoscale device according to any of preceding items 46, wherein the third facet layer is an inert material, such as an inert metal, selected from the group of gold, platinum, iridium, palladium, osmium, silver, rothenium and rhodium.
48. The nanoscale device according to any of preceding items 46 to 47, wherein the thickness of the third facet layer is between 3 and 10 nm, or less than 10 nm, or less than 5 nm, or less than 4 nm, or less than 3 nm, or less than 2 nm, or less than 1 nm.
49. The nanoscale device according to any of preceding items 38 to 48, wherein the first facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.
50. The nanoscale device according to any of preceding items 38 to 49, wherein the first facet layer is Al.
51. The nanoscale device according to any of preceding items 38 to 50, wherein the second facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.
52. The nanoscale device according to any of preceding items 38 to 51, wherein the second facet layer is an alloy, such as an alloy selected from the group of $MgB_2$, niobium alloys, such as NiTi, NbTiN with various fractions of Ti and N, and $Zr_{100-x}M_x$ where x is any number in the range of 0 to 100 and M is a metal selected from the group of Fe, Co, Ni, Cu, Ru, Rh, Pd, Os, Ir, Pt and Au.
53. The nanoscale device according to any of preceding items 38 to 51, wherein the second facet layer is a ceramic material, such as selected from the group of cuprates, such as YBCO ($YBa_2Cu_3O_{7-x}$).
54. The nanoscale device according to any of preceding items 38 to 53, wherein the second facet layer is a material with superconducting properties below a critical temperature.
55. The nanoscale device according to any of preceding items 38 to 54, wherein the crystalline nanostructure is provided in a semiconducting material.
56. The nanoscale device according to any of preceding items 38 to 55, wherein the crystalline nanostructure is provided in a semiconducting material selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.
57. A quantum point contact comprising the nanoscale device according to any of preceding items having a semiconducting core and a superconducting facet layer.
58. The quantum point contact according to item 57, comprising
    a first section where the semiconducting core has been exposed and brought in contact with a normal conductor, such as Au,
    a second section where the semiconducting core is exposed, and
    a third section wherein the superconducting surface of the nanoscale device is brought in contact with a superconductor.
59. A superconducting field effect transistor comprising one or more of the nanoscale devices according to any of the preceding items.
60. A method for producing a nanoscale device comprising the steps of
    a) growing, at an elevated temperature, one or more crystalline nanostructures in the normal direction on a plane substrate,
    b) lowering the temperature and optionally reducing the background pressure,
    c) further reducing the temperature thereby cooling the substrate with the crystalline nanostructures to a temperature below 20° C., and
    d) depositing, at said reduced temperature below −20° C., a first facet layer directly on at least one side facet of the crystalline nanostructures.
61. The method according to any of preceding method items, wherein the crystalline nanostructure and the deposition of the first facet layer are provided by means of molecular beam epitaxy (MBE)
62. The method according to any of preceding method items, wherein the step of growing crystalline nanostructure(s) is provided by means of the vapour liquid solid (VLS) method.
63. A method for producing a nanoscale device in a vacuum chamber by means of molecular beam epitaxy (MBE), the method comprising the steps of
    a) growing, preferably by means of vapour liquid solid (VLS) growth, at an elevated temperature of above 400° C., one or more elongated crystalline nanostructures, such as nanowire (crystals), in the normal direction on a plane substrate,
    b) shutting off all sources of growth material and reducing the temperature thereby cooling the substrate with the crystalline nanostructures to a temperature below −30° C., and
    c) depositing, at said reduced temperature below −30° C., a crystalline first facet layer directly on at least one side facet of the crystalline nanostructures by means of MBE.
64. The method according to any of preceding method items, wherein the plane substrate is located in a vacuum chamber, e.g. MBE chamber, and prepared with catalysing particles, such as Au particles.
65. The method according to any of preceding method items, wherein the substrate is rotated during deposition of the first facet layer to cover additional side facets of the crystalline nanostructures.

66. The method according to any of preceding method items, wherein the source for the first facet layer is located at a finite angle to the normal direction of the substrate during deposition of said first facet layer.
67. The method according to any of preceding method items, wherein the temperature of the substrate before and during deposition of the first facet layer is reduced to a temperature below 10° C., or below 0° C., or below −5° C., or below −10° C. or below −15° C., more preferably below −20° C., yet more preferably below −25° C., most preferably below −30° C.
68. The method according to any of preceding method items, wherein the thickness of the first facet layer is less than 50 nm, or less than 40 nm, or less than 30 nm, more preferably less than 25 nm, even more preferably less than 20 nm, and even more preferably less than 15 nm, yet more preferably less than 10 nm, most preferably less than 5 nm.
69. The method according to any of preceding method items, further comprising the step of kinking the growth direction of the crystalline nanostructure during growing of said structure.
70. The method according to item 69, wherein the growth direction is kinked by means of a short flush of $Ga^{25}$ or by means of a short temperature drop during growing of the crystalline nanostructure.
71. The method according to any of preceding method items, wherein the step of growing comprises growing the elongated crystalline nanostructure of the nanoscale device according to any of preceding items 1-56.
72. The method according to any of preceding method items, wherein the step of depositing comprising depositing the first facet layer of the nanoscale device according to any of preceding items 1-56.
73. The method according to any of preceding method items, wherein the first facet layer is a metal selected from the group of Al, Ne, Ar, Ca, Ni, Cu, Kr, Sr, Rh, Pd, Ag, Xe, Ce, Yb, Ir, Pt, Au, Pb, Ac, Th, Li, Na, K, V, Cr, Fe, Rb, Nb, Mo, Cs, Ba, Eu, Ta and W.
74. The method according to any of preceding method items, further comprising the step of depositing a second facet layer covering at least a part of the first facet layer, the second facet layer being different from the first facet layer.
75. The method according to any of preceding method items 74, wherein the material of the second facet layer is different from the material of the first facet layer
76. The method according to any of preceding method items, wherein the first facet layer has a crystalline structure which is epitaxially matched with the crystalline structure of the nanostructure.
77. The method according to any of preceding method items 74-76, wherein the second facet layer has a crystalline structure which is not epitaxially matched with the crystalline structure of the nanostructure.
78. The method according to any of preceding method items 74-77, wherein the crystalline nanostructure is provided in semiconducting material, the first facet layer is provided in a first material with superconducting properties below a first critical temperature, and the second facet layer is provided in a second material with superconducting properties below a second critical temperature.
79. The method according to any of preceding method items 78, wherein the first critical temperature is lower than the second critical temperature.
80. The method according to any of preceding method items 74-79, further comprising the step of depositing a third facet layer before depositing the second facet layer, such that the third facet layer is located between the first facet layer and the second facet layer, the third facet layer being different from the first and second facet layers, preferably the material of the third facet layer is different from the materials of the first and second facet layers.
81. The method according to any of preceding method items 80, wherein the third facet layer is provided in an inert material, such as an inert metal, selected from the group of gold, platinum, iridium, palladium, osmium, silver, rothenium and rhodium.
82. The method according to any of preceding method items 80 to 81, wherein the thickness of the third facet layer is between 3 and 10 nm, or less than 10 nm, or less than 5 nm, or less than 4 nm, or less than 3 nm, or less than 2 nm, or less than 1 nm.
83. The method according to any of preceding method items 74-82, wherein the second facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.
84. The method according to any of preceding method items 74-83, wherein the second facet layer is an alloy, such as an alloy selected from the group of $MgB_2$, niobium alloys, such as NiTi, NbTiN with various fractions of Ti and N, and $Zr_{100-x}M_x$ where x is any number in the range of 0 to 100 and M is a metal selected from the group of Fe, Co, Ni, Cu, Ru, Rh, Pd, Os, Ir, Pt and Au.
85. The method according to any of preceding method items 74-84, wherein the second facet layer is a ceramic material, such as selected from the group of cuprates, such as YBCO ($YBa_2Cu_3O_{7-x}$).
86. The method according to any of preceding method items 74-85, wherein the second facet layer is a material with superconducting properties below a critical temperature.
87. The method according to any of preceding method items 74-83, wherein the crystalline nanostructure is provided in a semiconducting material.
88. The method according to any of preceding method items, wherein the crystalline nanostructure is provided in a semiconducting material selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.
89. The method according to any of preceding method items, wherein the step of depositing the second facet layer comprises depositing the second facet layer of the nanoscale device according to any of preceding items 1-56.
90. The method according to any of preceding method items, wherein the step of depositing the third facet layer comprises depositing the third facet layer of the nanoscale device according to any of preceding items 1-56.
91. The method according to any of preceding method items, wherein the steps of growing and depositing of the first, second and/or third facet layer(s) are provided by means of molecular beam epitaxy (MBE).
92. The method according to any of preceding method items, wherein the steps of growing and depositing of the first facet layers are provided by means of molecular beam epitaxy (MBE), whereas the step of depositing the second facet layer and/or the third facet layer is provided by means of a different deposition process, such as evaporation, sputtering, pulsed laser deposition or chemical vapor deposition.

93. The method according to any of preceding method items, wherein at least one of said elongated crystalline nanostructures comprises at least one kink such that said elongated crystalline nanostructures initially one section that is normal to the substrate and one section that is substantially parallel to the substrate.

94. A nanoscale device obtained by the method according to any of preceding method items.

95. A method for producing a metallic contact and/or interface to a semiconductor one-dimensional crystalline nanostructure (nanowire).

96. A nanoscale device obtained by the method according to any of preceding items comprising one of said elongated crystalline nanostructures, such as a nanowire (crystal) or nanowhisker (crystal) or nanorod (crystal), having a plurality of substantially plane side facets and the crystalline facet layer covering at least a part of one or more of said side facets.

97. The nanoscale device according to item 96, wherein each two-dimensional interface between a side facet of the crystalline nanostructure and the first facet layer are epitaxially matched, domain matched and/or lattice matched in both dimensions.

98. The nanoscale device according to any of preceding items, wherein the crystal structure of the elongated crystalline nanostructure is selected from the group of zincblende and wurtzite.

99. The nanoscale device according to any of preceding items, wherein the crystalline nanostructure is provided in a semiconducting material selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.

100. The nanoscale device according to any of preceding items, wherein the crystal structure of the first facet layer is selected from the cubic crystal system, such as primitive cubic, BCC or FCC, or orthorhombic, trigonal, tetragonal or perovskite.

101. The nanoscale device according to any of preceding items, wherein the first facet layer is provided in a material with superconducting properties below a critical temperature $T_c$.

102. The nanoscale device according to any of preceding items, wherein the thickness of the first facet layer is less than 10 nm.

103. The nanoscale device according to any of preceding items, wherein the first facet layer comprises one or more large single crystal segments wherein the interface between the elongated crystalline nanostructure and said single crystal segment(s) is epitaxially matched, such as simultaneously epitaxially matched on all side facets.

104. The nanoscale device according to any of preceding items, wherein the elongated crystalline nanostructure is substantially one-dimensional.

105. The nanoscale device according to any of preceding items, wherein the crystalline nanostructure is a heterostructured nanowire crystal composed of varying compounds in the axial and/or radial direction.

What is claimed is:

1. A nanoscale device comprising
   an elongated crystalline semiconductor nanostructure having a plurality of substantially plane side facets, and
   a crystalline structured first facet layer of a superconductor material covering at least a part of at least one of said side facets,
   wherein the crystalline structure of the semiconductor nanostructure is epitaxially matched with the crystalline structure of the first facet layer on the interface between the two crystalline structures.

2. The nanoscale device according to claim 1, wherein the epitaxial match and the proximity between the crystalline structures of the semiconductor nanostructure and the superconductor first facet layer is configured to induce a superconductor hard gap in the semiconductor nanostructure.

3. The nanoscale device according to claim 1, wherein each two-dimensional interface between a plane surface of the crystalline semiconductor nanostructure and the first facet layer is at least one of: (a) domain matched in at least one dimension and (b) lattice matched in at least one dimension.

4. The nanoscale device according to claim 1, wherein each two-dimensional interface between a plane surface of the crystalline semiconductor nanostructure and the first facet layer is domain matched in both dimensions and lattice matched in both dimensions.

5. The nanoscale device according to claim 1, wherein the crystal structure of the crystalline semiconductor nanostructure and the crystal structure of the first facet layer belong to different lattice systems.

6. The nanoscale device according to claim 1, wherein the Bravais lattice of the crystalline semiconductor nanostructure is different from the Bravais lattice of the first facet layer.

7. The nanoscale device according to claim 1, wherein the crystalline semiconductor nanostructure is substantially one-dimensional.

8. The nanoscale device according to claim 1, wherein the crystalline semiconductor nanostructure is provided in a semiconducting material selected from at least one of the collection of: group III-V combinations, group IV elements, group IV combinations, group II-VI combinations and group I-VII combinations.

9. The nanoscale device according to claim 1, wherein the superconductor material of the first facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.

10. The nanoscale device according to claim 1, further comprising further comprising a second facet layer of a superconductor material covering at least a part of the first facet layer, the superconductor material of the second facet layer being different from the superconductor material of the first facet layer.

11. The nanoscale device according to claim 1, wherein the cross-section of the crystalline semiconductor nanostructure is one of: (a) square providing a total of four side facets and (b) hexagonal providing a total of six side facets.

12. A quantum point contact comprising:
    a nanoscale device comprising:
    an elongated crystalline semiconductor nanostructure having a plurality of substantially plane side facets,
    a crystalline structured first facet layer of a superconductor material covering at least a part of at least one of said side facets, wherein the crystalline structure of the semiconductor nanostructure is epitaxially matched with the crystalline structure of the first facet layer on the interface between the two crystalline structures,
a first section where the semiconducting core has been exposed and brought in contact with a normal conductor,
a second section where the semiconducting core is exposed, and
a third section wherein the superconducting surface of the nanoscale device is brought in contact with a superconductor.

13. A superconducting field effect transistor comprising at least one nanoscale device according to claim 1.

14. A method for producing a nanoscale device in a vacuum chamber by means of molecular beam epitaxy (MBE), the method comprising the steps of
   a) growing, by means of vapour liquid solid (VLS) growth, at a temperature above 400° C., at least one elongated crystalline nanostructure in the normal direction on a plane substrate,
   b) shutting off all sources of growth material and reducing the temperature, thereby cooling the substrate with the crystalline nanostructures to a temperature below −30° C., and
   c) depositing, at said reduced temperature below −30° C., a crystalline first facet layer directly on at least one side facet of the crystalline nanostructures by means of MBE.

15. The method according to claim 14, wherein:
the step of growing comprises growing the elongated crystalline nanostructure such that the elongated crystalline semiconductor nanostructure has a plurality of substantially plane side facets, and
the nanoscale device comprises:
   a crystalline structured first facet layer of a superconductor material covering at least a part of at least one of said side facets,
   wherein the crystalline structure of the semiconductor nanostructure is epitaxially matched with the crystalline structure of the first facet layer on the interface between the two crystalline structures.

16. The method according to claim 14, further comprising the step of depositing a second facet layer covering at least a part of the first facet layer, the material of the second facet layer being different from the material of the first facet layer.

17. The method according to claim 16, wherein the step of depositing the second facet layer comprises depositing the second facet layer of the nanoscale device such that:
the elongated crystalline semiconductor nanostructure has a plurality of substantially plane side facets, and
the nanoscale device comprises:
   a crystalline structured first facet layer of a superconductor material covering at least a part of at least one of said side facets and
   a second facet layer of a superconductor material covering at least a part of the first facet layer, the superconductor material of the second facet layer being different from the superconductor material of the first facet layer,
wherein the crystalline structure of the semiconductor nanostructure is epitaxially matched with the crystalline structure of the first facet layer on the interface between the two crystalline structures.

18. A nanoscale device prepared by a process comprising the steps of:
   a. in a vacuum chamber, growing, at an elevated temperature of above 400° C., one or more elongated crystalline nanostructures in the normal direction on a plane substrate,
   b. shutting off all sources of growth material and reducing the temperature thereby cooling the substrate with the crystalline nanostructures to a temperature below −30° C., and
   c. depositing, at said reduced temperature below −30° C., a crystalline first facet layer directly on at least one side facet of the crystalline nanostructures by means of molecular beam epitaxy (MBE).

19. The nanoscale device according to claim 10, wherein the superconductor material of the second facet layer is a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.

20. The nanoscale device according to claim 10, wherein the epitaxial match between the crystalline structures of the semiconductor nanostructure and the superconductor first facet layer and the proximity and superconductor properties of the second facet layer are configured to induce a superconductor hard gap in the semiconductor nano structure.

* * * * *

UNITED STATES PATENT AND TRADEMARK OFFICE
CERTIFICATE OF CORRECTION

Page 1 of 1

PATENT NO. : 10,367,132 B2
APPLICATION NO. : 15/322701
DATED : July 30, 2019
INVENTOR(S) : Krogstrup et al.

It is certified that error appears in the above-identified patent and that said Letters Patent is hereby corrected as shown below:

In the Claims

In Column 36, Lines 51 and 52 replace:
"The nanoscale device according to claim 1, further comprising further comprising a second facet layer"
With:
"The nanoscale device according to claim 1, further comprising a second facet layer"

Signed and Sealed this
Fifth Day of May, 2020

Andrei Iancu
*Director of the United States Patent and Trademark Office*